United States Patent
Lin et al.

(10) Patent No.: US 12,156,473 B2
(45) Date of Patent: Nov. 26, 2024

(54) INDUCTOR/CORE ASSEMBLIES FOR INTEGRATED CIRCUITS

(71) Applicant: Intel Corporation, Santa Clara, CA (US)

(72) Inventors: Kevin L. Lin, Beaverton, OR (US); Nicholas James Harold McKubre, Portland, OR (US); Han Wui Then, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 878 days.

(21) Appl. No.: 16/631,681

(22) PCT Filed: Sep. 20, 2017

(86) PCT No.: PCT/US2017/052390
§ 371 (c)(1),
(2) Date: Jan. 16, 2020

(87) PCT Pub. No.: WO2019/059897
PCT Pub. Date: Mar. 28, 2019

(65) Prior Publication Data
US 2020/0152855 A1    May 14, 2020

(51) Int. Cl.
| | | |
|---|---|---|
| H01L 41/09 | (2006.01) | |
| H01F 27/24 | (2006.01) | |
| H01F 27/30 | (2006.01) | |
| H01L 49/02 | (2006.01) | |
| H10N 30/20 | (2023.01) | |

(52) U.S. Cl.
CPC ......... *H10N 30/2041* (2023.02); *H01F 27/24* (2013.01); *H01F 27/306* (2013.01); *H01L 28/10* (2013.01)

(58) Field of Classification Search
CPC ..... H01L 41/0933; H01L 28/10; H01F 27/24; H01F 27/306; H10N 30/2041
See application file for complete search history.

(56) References Cited

U.S. PATENT DOCUMENTS

| | | | | |
|---|---|---|---|---|
| 5,239,744 | A | * | 8/1993 | Fleming .................. H01F 41/16 |
| | | | | 29/432 |
| 2004/0032315 | A1 | * | 2/2004 | Illingworth ............... H01F 3/10 |
| | | | | 336/212 |

FOREIGN PATENT DOCUMENTS

| | | | | | |
|---|---|---|---|---|---|
| CN | 1802185 | A | * | 7/2006 | ........... A61N 1/3754 |
| EP | 3330980 | A1 | * | 6/2018 | ........... H01F 27/245 |
| JP | 08213245 | | | 8/1996 | |
| JP | 08213245 | A | * | 8/1996 | |
| JP | 08250361 | | | 9/1996 | |

(Continued)

OTHER PUBLICATIONS

International Search Report and Written Opinion in International Patent Application No. PCT/US2017/052390 dated Jun. 20, 2018, 11 pages.

(Continued)

*Primary Examiner* — Ermias T Woldegeorgis
(74) *Attorney, Agent, or Firm* — Akona IP PC

(57) ABSTRACT

Disclosed herein are inductor/core assemblies for integrated circuits (ICs), as well as related structures, methods, and devices. In some embodiments, an IC structure may include an inductor and a magnetic core in an interior of the inductor. The magnetic core may be movable perpendicular to a plane of the inductor.

19 Claims, 27 Drawing Sheets

(56) References Cited

FOREIGN PATENT DOCUMENTS

JP       2004319875 A  *  11/2004
WO       2019059897 A1     3/2019

OTHER PUBLICATIONS

Wu et al., "Piezoelectric MEMS Power Generators for Vibration Energy Harvesting," Ch. 6 of Small-Scale Energy Harvesting, accessed at http://www.intechopen.com/books/small-scale-energy-harvesting on Aug. 24, 2017.

* cited by examiner

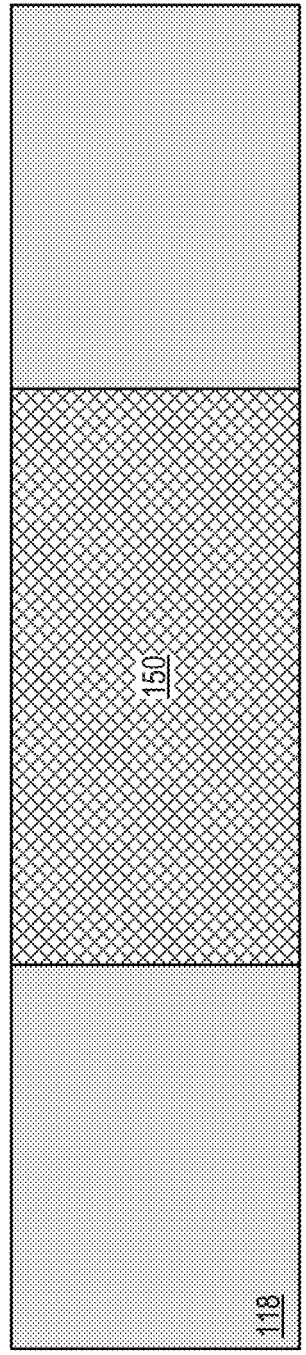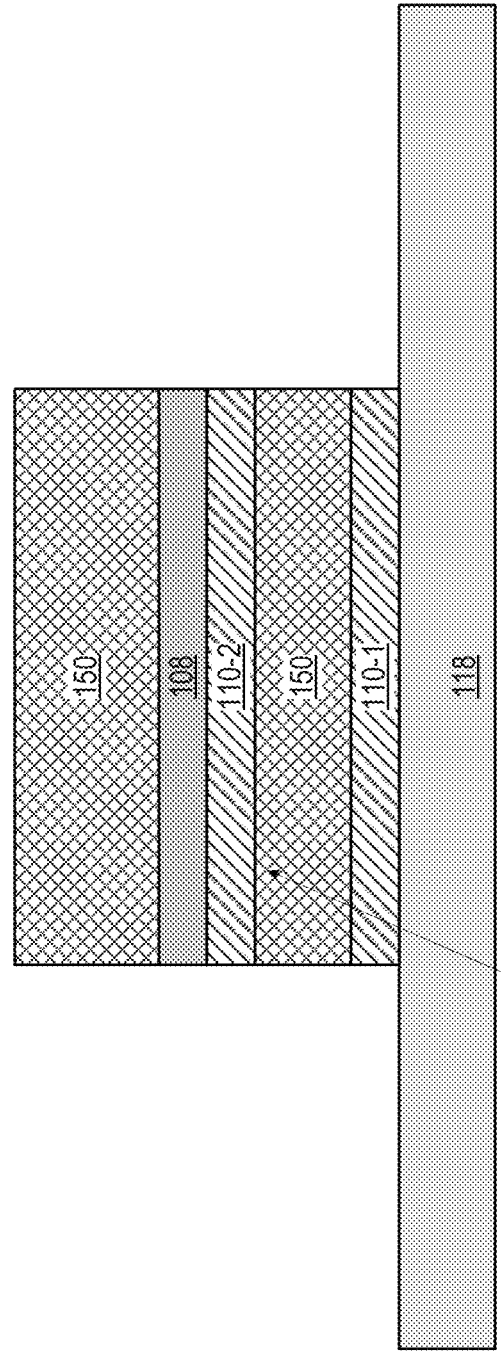
FIG. 10A
FIG. 10B

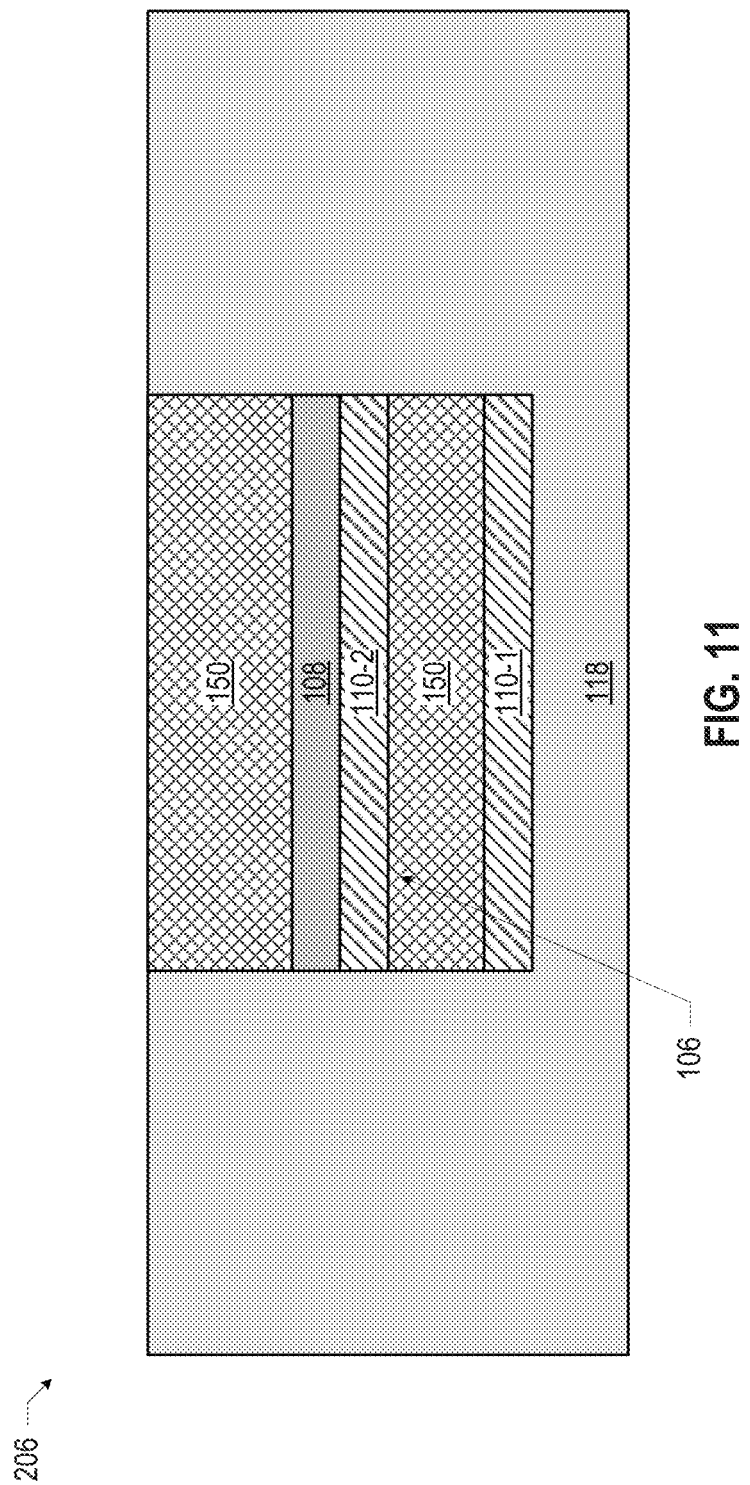

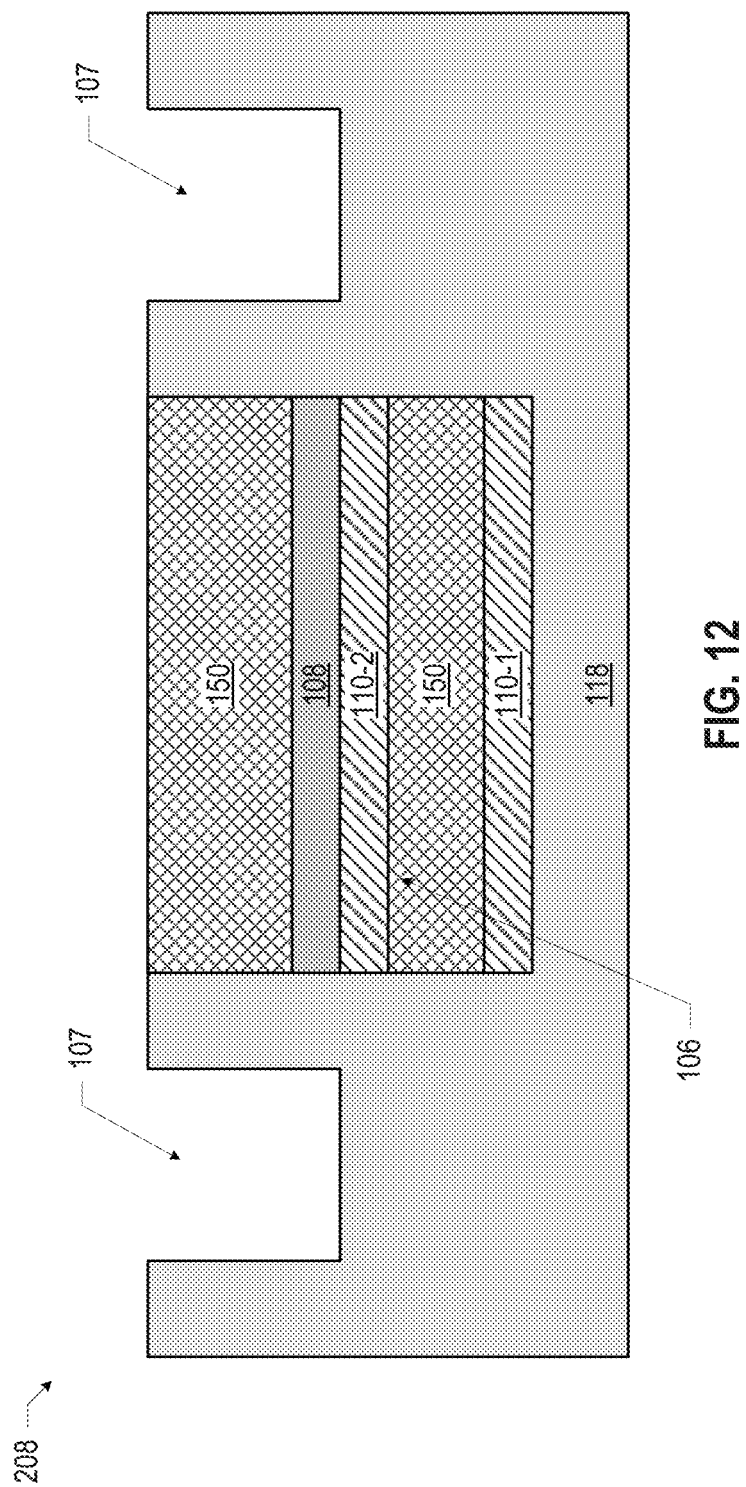

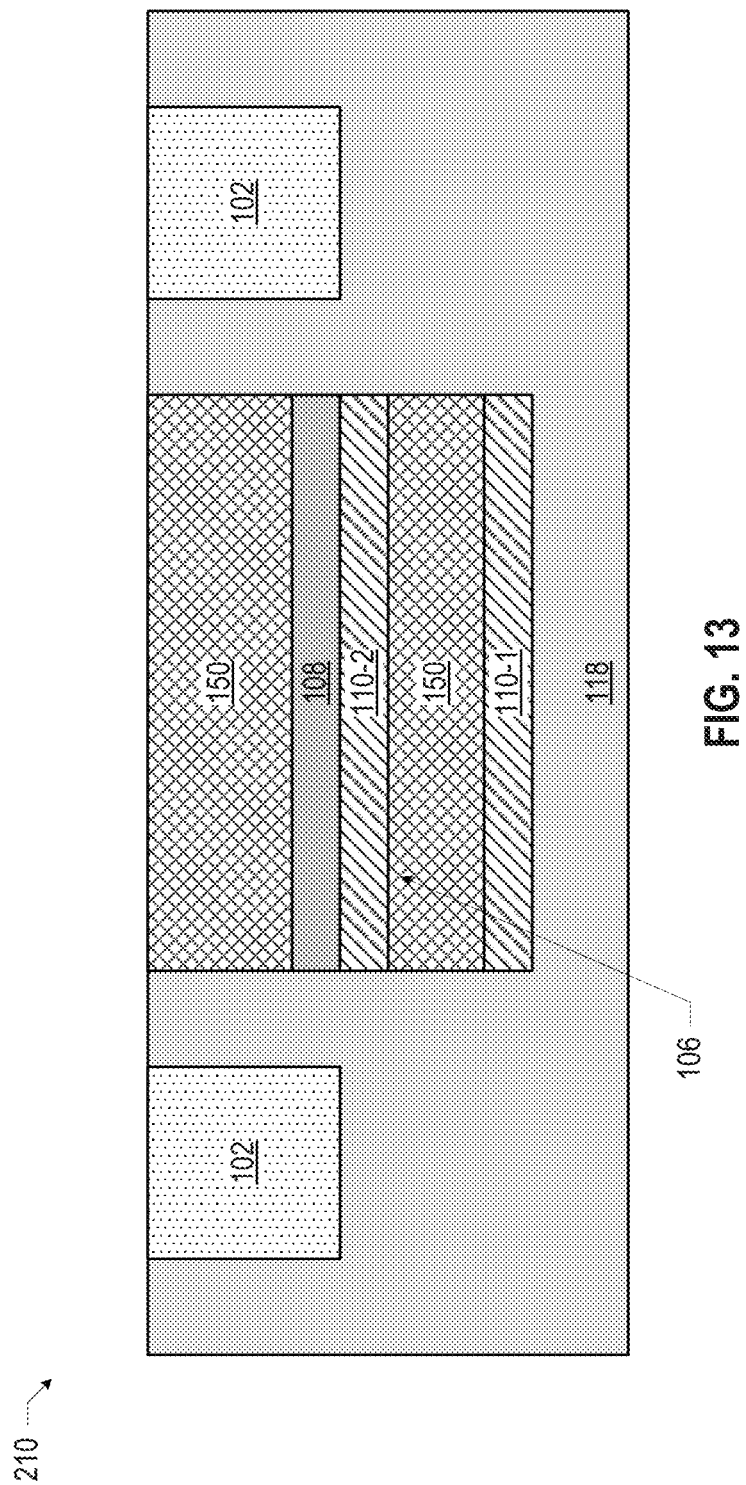

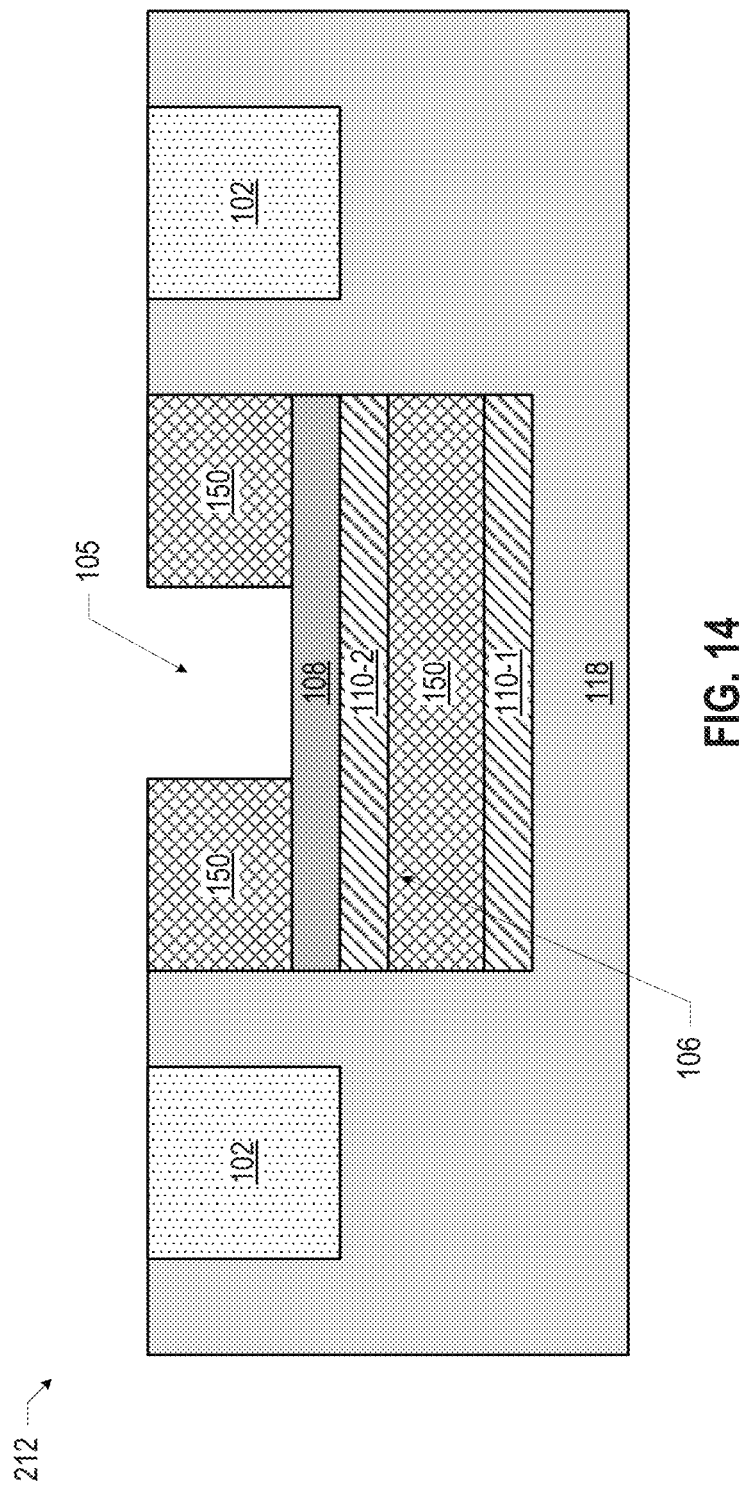

INDUCTOR/CORE ASSEMBLIES FOR INTEGRATED CIRCUITS

CROSS-REFERENCE TO RELATED APPLICATION

This application is a national stage application under 35 U.S.C. § 371 of PCT International Application Serial No. PCT/US2017/052390, filed on Sep. 20, 2017 and entitled "INDUCTOR/CORE ASSEMBLIES FOR INTEGRATED CIRCUITS," which is hereby incorporated by reference herein in its entirety.

BACKGROUND

Some integrated circuit (IC) devices may include an inductor (e.g., for use in radio frequency communication). Inductors are typically large, taking up valuable area in a chip.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIGS. 8, 9A-9B, 10A-10B, and 11-19 illustrate stages in an example process of manufacturing the inductor/core assembly of FIG. 1, in accordance with various embodiments.

DETAILED DESCRIPTION

Figure 1A:
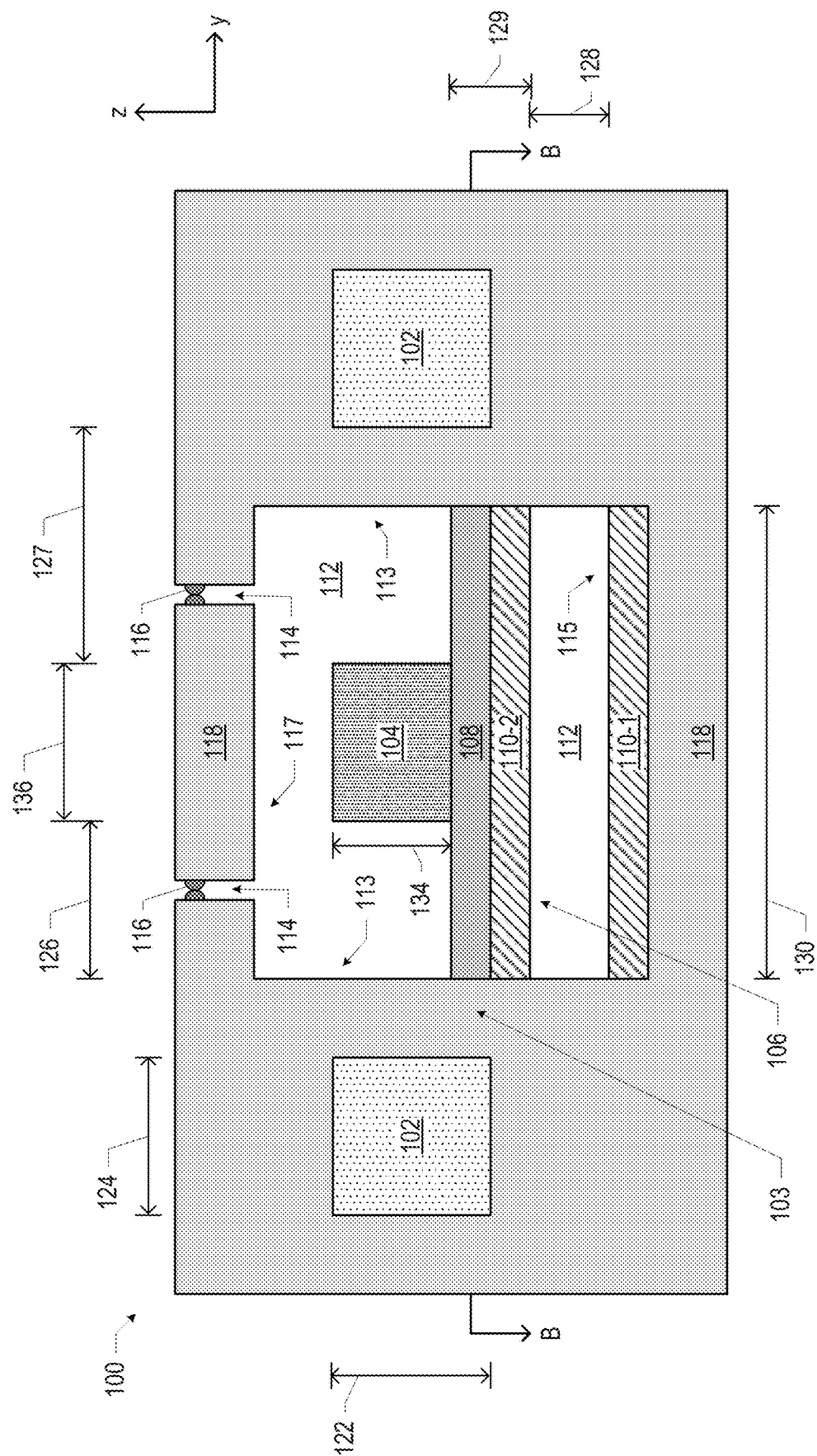
FIGS. 1A-1C are various views of an example inductor/core assembly, in accordance with various embodiments.

Disclosed herein are inductor/core assemblies for integrated circuits (ICs), as well as related structures, methods, and devices. In some embodiments, an IC structure may include an inductor and a magnetic core in an interior of the inductor. The magnetic core may be movable perpendicular to a plane of the inductor.

Some IC devices may include inductors (e.g., as part of power circuitry). Inductors may be formed by a length of conductive material shaped as a loop with one or more turns. The inductance of an inductor is proportional to, among other things, the area within its turns. To achieve a large enough inductance (e.g., for power circuitry applications, such as buck-boost converters), inductors have conventionally taken up a lot of room within an IC device. Attempting to reduce the volume of an inductor by reducing the thickness of its "wire" may result in an undesirable increase in the resistance of the inductor.

Further, ICs that are to operate at multiple frequencies have conventionally required multiple different inductors with different inductances to achieve the desired frequencies (e.g., radio frequencies for communication devices). The conventional need for multiple inductors has compounded the area requirements for inductors in dies.

Various ones of the inductor/core arrangements disclosed herein allow the inductance of an inductor to be dynamically tuned, enabling a single physical inductor to take the place of multiple conventional inductors, saving space on a die. Various ones of the embodiments disclosed herein may thus allow IC devices to be made smaller without sacrificing performance.

In the following detailed description, reference is made to the accompanying drawings that form a part hereof wherein like numerals designate like parts throughout and, in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The drawings are not necessarily to scale. Although many of the drawings illustrate rectilinear structures with flat walls and right-angle corners, this is simply for ease of illustration and actual devices made using these techniques will exhibit rounded corners, surface roughness, and other features.

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a "package" and an "IC package" are synonymous. When used to describe a range of dimensions, the phrase "between X and Y" represents a range that includes X and Y. For convenience, the phrase "FIG. 1" may be used to refer to the collection of drawings of FIGS. 1A-1C, the phrase "FIG. 5" may be used to refer to the collection of drawings of FIGS. 5A-5B, etc.

Figure 1B:
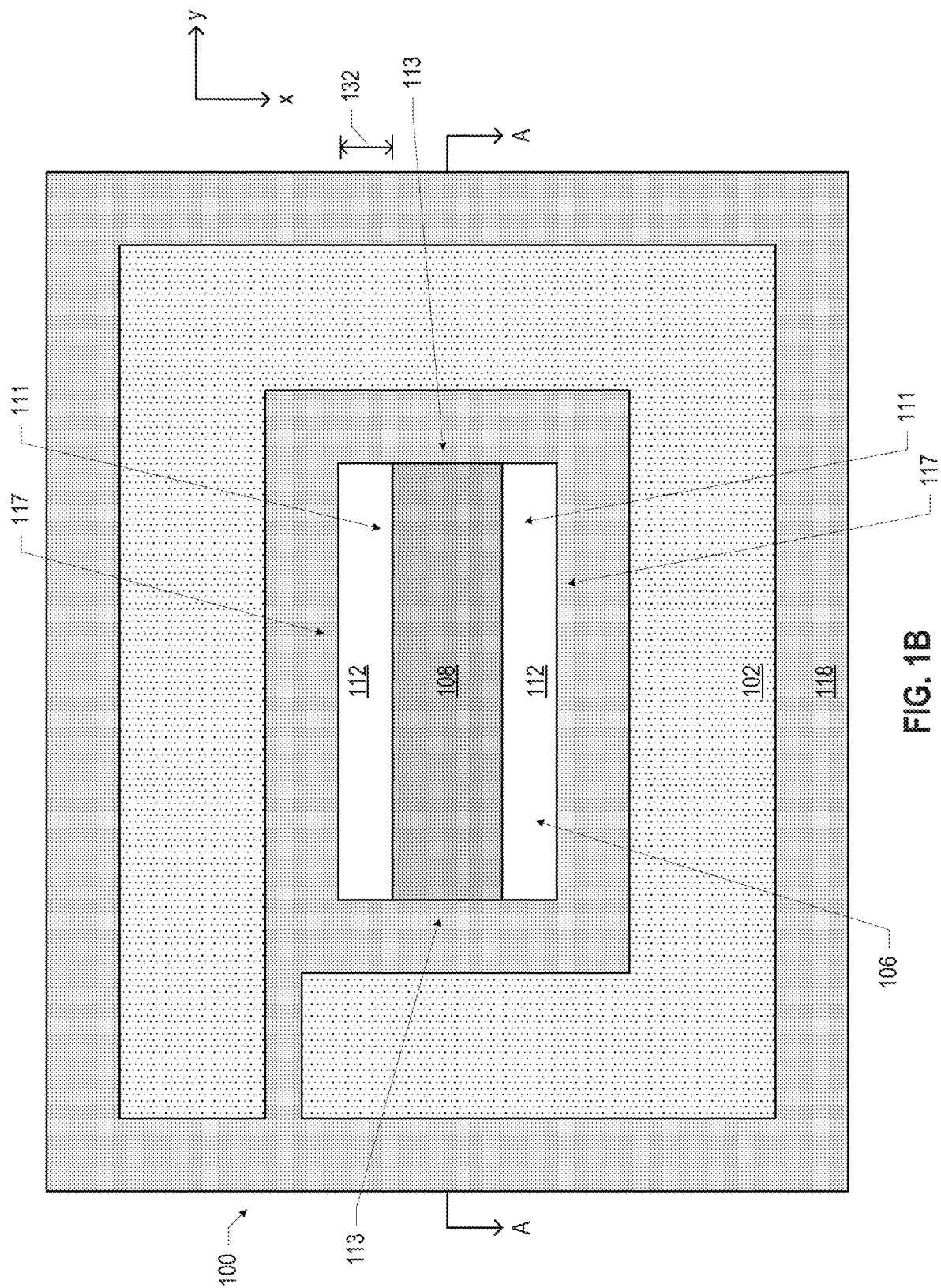
Figure 1C:
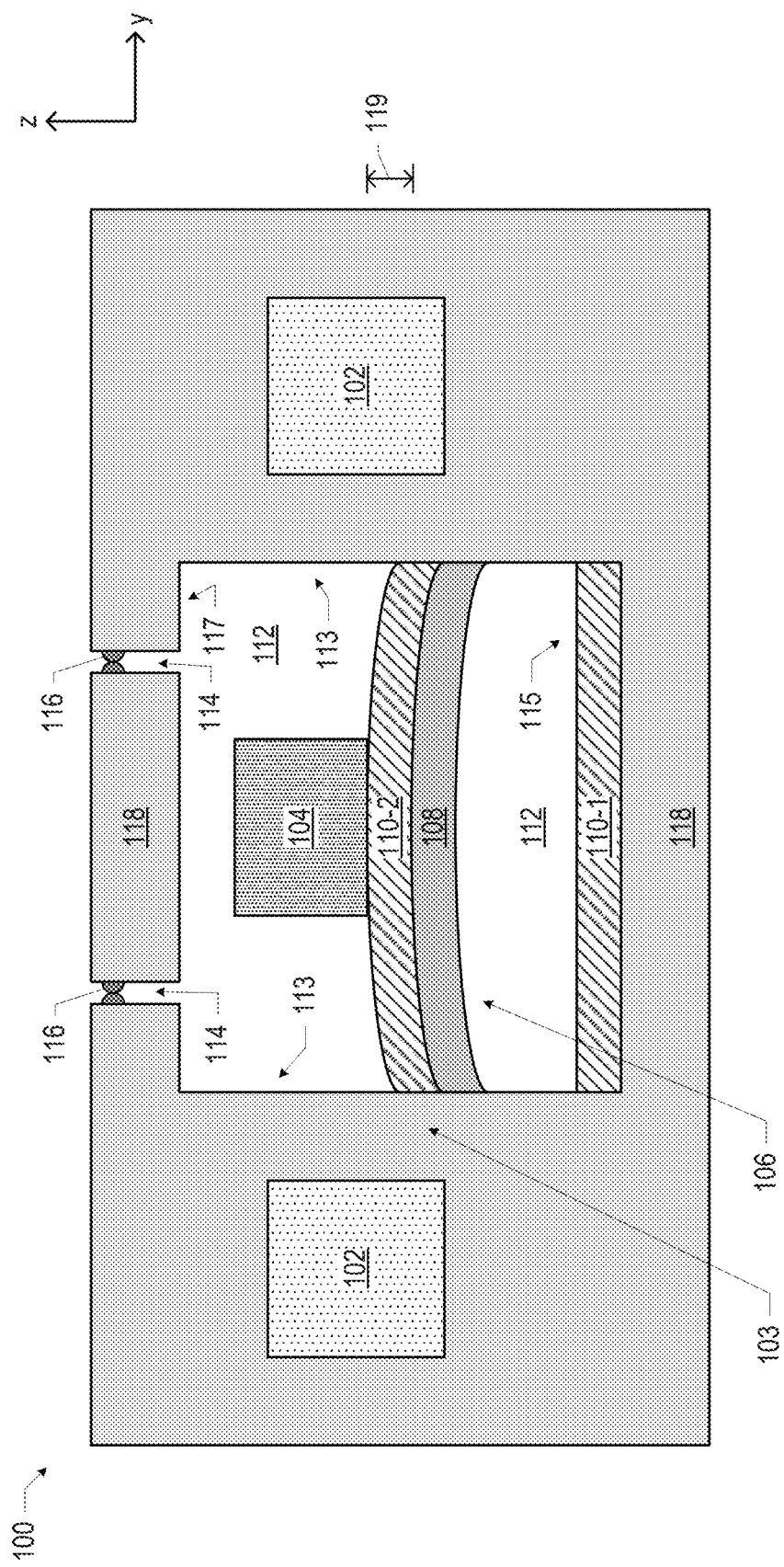

FIG. 1 provides various views of an example inductor/core assembly 100 (also referred to herein as an "assembly 100"), in accordance with various embodiments. In particular, FIG. 1A is a side cross-sectional view of the assembly 100 (through the section A-A of FIG. 1B), FIG. 1B is a top cross-sectional view (through the section B-B of FIG. 1A), and FIG. 1C is a side cross-sectional view of the assembly 100 when the magnetic core 104 is moved "upward" relative to its position in FIG. 1A. The assembly 100 of FIG. 1 may be an IC structure included, for example, in the back end of a die (e.g., as discussed below with reference to FIG. 29) or in a package substrate (e.g., as discussed below with reference to FIG. 30).

The assembly 100 of FIG. 1 may include an inductor 102 and an air gap 112 disposed at least partially in an interior 103 of the inductor 102. A magnetic core 104 may be disposed in the air gap 112. The magnetic core 104 may be movable within the air gap 112 (e.g., in the z-direction, in accordance with the coordinate system indicated in FIG. 1). In some embodiments, the inductor 102 may at least partially be disposed in a plane (e.g., the plane illustrated in FIG. 1B), and the magnetic core 104 may be movable in a direction perpendicular to the plane. As used herein, "movable perpendicular to a plane of an inductor" may refer to movement that has at least some component that is perpendicular to the plane of the inductor.

In some embodiments, the magnetic core 104 may be supported by a beam 106 within the air gap 112. In particular, the air gap 112 may have two opposing walls 113, and the beam 106 may span the air gap 112 between the opposing walls 113 (and may extend further, as discussed below). In the embodiment of FIG. 1, the magnetic core 104 may be disposed on a top surface of the beam 106, while in other embodiments, the magnetic core 104 may be at least partially in the plane of the beam 106 (e.g., as discussed below with reference to FIG. 5). The air gap 112 may extend under the beam 106, around the longitudinal edges 111 of the beam 106, and above the beam 106. The air gap 112 may be filled with air or another fluid (e.g., liquid or gas) or may be under vacuum.

The walls 113 of the air gap 112 may be provided by a dielectric material 118. In some embodiments, the dielectric material 118 may be an interlayer dielectric (ILD), such as silicon oxide. In the embodiment of FIG. 1, the ceiling 117 of the air gap 112 may also be substantially provided by the dielectric material 118. The ceiling 117 may include inlets 114 that are sealed by a seal material 116; as discussed below, the inlets 114 may be used during manufacturing to form the air gap 112, and the seal material 116 may seal the air gap 112. Although two inlets 114 are shown in FIG. 1, this is simply illustrative, and more or fewer inlets 114 may be used as appropriate.

The inductor 102 may also be embedded in the dielectric material 118. Although FIG. 1 shows the inductor 102 as having only a single turn, this is simply for ease of illustration, and the inductor 102 may have multiple turns (i.e., to form a coil-like structure whose longitudinal axis extends in the z-direction). In such embodiments, the air gap 112 may be disposed in the interior 103 of the inductor 102 but may or may not extend throughout the entire interior 103 (and instead, for example, may be proximate to one "end" of the coil or the other).

As noted above, during operation of the assembly 100, the magnetic core 104 may be moved relative to the inductor 102. In particular, the magnetic core 104 may be moved so that some or all of the magnetic core 104 is no longer in an interior 103 of the inductor 102. The greater the volume of the magnetic core 104 that is within the interior 103 of the inductor 102, the greater the inductance of the inductor 102 (and vice versa). Thus, moving the magnetic core 104 relative to the inductor 102 may allow the inductance of the inductor 102 to be tuned to a desired value. This may be particularly useful in ICs that are to operate at multiple frequencies, as noted above.

The magnetic core 104 may be moved within the air gap 112 in any of a number of ways. In some embodiments, an electrostatic mechanism may be used. For example, in the embodiment of FIG. 1, the air gap 112 may have a floor 115 provided by an electrode material 110-1, and the beam 106 may include an electrode material 110-2. In particular, the beam 106 may include an electrode material 110-2 and a dielectric material 108. In the embodiment illustrated in FIG. 1, the dielectric material 108 is disposed between the electrode material 110-2 and the magnetic core 104 (such that the magnetic core 104 is in contact with the dielectric material 108), but in other embodiments, the electrode material 110-2 may be between the dielectric material 108 and the magnetic core 104, or the dielectric material 108 may not be included (e.g., as discussed below with reference to FIG. 2). The electrode material 110-1 may be disposed on the dielectric material 118, and a portion of the air gap 112 may separate the electrode materials 110-1 and 110-2. In FIG. 1, the electrode material 110-2 is illustrated as extending between the walls 113, but this need not be the case; in some embodiments, electrode material 110-2 may not extend all the way to the walls 113 but may be limited to a more central portion of the dielectric material 108 of the beam 106. Similarly, the electrode material 110-1 may not extend all the way to the walls 113. In some embodiments, the electrode material 110-1 may not provide the floor 115 of the air gaps 112 but may be separated from the floor 115 by some amount of the dielectric material 118. Any of the electrode materials disclosed herein may have any suitable shape (e.g., solid, interdigitated, etc.).

In the embodiment of FIG. 1, differential voltages may be applied to the electrode materials 110-1 and 110-2 to cause the electrode materials 110-1 and 110-2 to exert a force on each other (e.g., attract each other) and thus deform the beam 106. For example, FIG. 1C illustrates a configuration in which the electrode materials 110-1 and 110-2 are provided with voltages of the same polarity (e.g., both positive or both negative), inducing a force that pushes the electrode materials 110-1 and 110-2 away from each other. This force may cause the beam 106 to bend "upward," as shown, reducing the amount of the magnetic core 104 that is coplanar with the inductor 102 and thus reducing the impedance of the inductor 102 relative to the configuration of FIG. 1A. The magnitude of the deformation of the beam 106 may be controlled by the magnitude of the voltages between the electrode materials 110-1 and 110-2, among other factors. In other configurations, the electrode materials 110-1 and 110-2 may be provided with voltages of opposite polarities (e.g., one positive and one negative), inducing a force that pulls the electrode materials 110-1 and 110-2 towards each other. This force may cause the beam 106 to bend "downward," (not shown), which may reduce the amount of the magnetic core 104 that is coplanar with the inductor 102 and thus reduce the impedance of the inductor 102 relative to the configuration of FIG. 1A.

Although FIGS. 1A and 1C are discussed above as illustrating configurations in which the magnetic core 104 is coplanar with the inductor 102 when no voltages are applied to the electrode materials 110-1 and 110-2 (and the magnetic core 104 is less or not coplanar otherwise), this need not be the case. In some embodiments, the magnetic core 104 may not be coplanar with the inductor 102 (or may be less coplanar) when no voltages are applied to the electrode materials 110-1 and 110-2; applying an appropriate voltage to the electrode materials 110-1 and 110-2 may deform the beam 106 so as to increase the coplanarity between the magnetic core 104 and the inductor 102. For example, the configuration of FIG. 1C may represent the assembly 100 "at rest," and the configuration of FIG. 1A may represent the assembly 100 when voltages of opposite polarities are applied to the electrode materials 110-1 and 110-2.

For ease of illustration, FIG. 1 (and others of the accompanying figures) do not explicitly illustrate conductive pathways to the electrode materials 110 that may be used to provide the desired electrical signals to the electrode materials 110. The assembly 100 may include such pathways, which themselves may include conductive lines and/or conductive vias, as discussed below with reference to FIG. 29. In particular, a die or other IC component that includes an assembly 100 may also include, or be communicatively coupled to, control circuitry that may provide electrical signals through such conductive pathways to the electrode materials 110 to achieve a desired inductance for the inductor 102.

Any suitable materials may be included in the assembly 100. For example, the inductor 102 may include any suitable conductive materials, such as metals (e.g., copper, tungsten, or titanium). In some embodiments, the electrode materials 110 may include any suitable conductive materials, such as metals. In some embodiments, the dielectric material 108 of the beam 106 may include an oxide (e.g., silicon oxide), a nitride (e.g., silicon nitride), an organic polymer, and/or a silicone (e.g., polydimethylsiloxane). In some embodiments, the dielectric material 108 of the beam 106 may have the same material composition as the dielectric material 118, while in other embodiments, the dielectric material 108 of the beam 106 may have a different material composition from the dielectric material 118. A number of embodiments of the magnetic core 104 are discussed below. In some embodiments, the seal material 116 may include an oxide (e.g., silicon oxide) or a nitride (e.g., silicon nitride).

The assembly 100 may have any suitable dimensions. In some embodiments, the width 124 of a segment of the inductor 102 may be between 0.5 microns and 3 microns (e.g., between 0.75 microns and 1.25 microns). In some embodiments, the thickness 122 of a segment of the inductor 102 may be between 2 microns and 5 microns (e.g., between 2 microns and 4 microns, or between 2.5 microns and 3.5 microns). In some embodiments, the distance 126 between the magnetic core 104 and a wall 113 may be between 50 microns and 200 microns (e.g., between 75 microns and 125 microns). In some embodiments, the distance 127 between the magnetic core 104 and the inductor 102 may be between 50 microns and 200 microns (e.g., between 100 microns and 150 microns). In some embodiments, the width 136 of the magnetic core 104 may be between 100 nanometers and 4 microns. In some embodiments, the thickness 134 of the magnetic core 104 may be between 2 microns and 5 microns (e.g., between 2 microns and 4 microns). In some embodiments, the distance 128 between the floor 115 of the air gap 112 and the beam 106 may be greater than 100 nanometers (e.g., between 100 nanometers and 2 microns). In some embodiments, the length 130 of the beam 106 in the air gap 112 (equal to the distance between the opposing walls 113) may be between 50 microns and 200 microns (e.g., between 75 microns and 150 microns, or between 75 microns and 125 microns). In some embodiments, the distance between the longitudinal edges 111 of the beam 106 and the walls 117 of the air gap 112 may be between 2 nanometers and 20 nanometers (e.g., between 5 nanometers and 10 nanometers). In some embodiments, the thickness 129 of the beam 106 may be between 1 micron and 100 microns. In some embodiments, a distance 132 between the beam 106 and the walls 117 may be between 1 micron and 100 microns. In some embodiments, the amount of deflection 119 achievable during operation of the assembly 100 (e.g., as illustrated in FIG. 1C), may be between 0.5 microns and 5 microns (e.g., between 0.5 microns and 2 microns).

Figure 2:
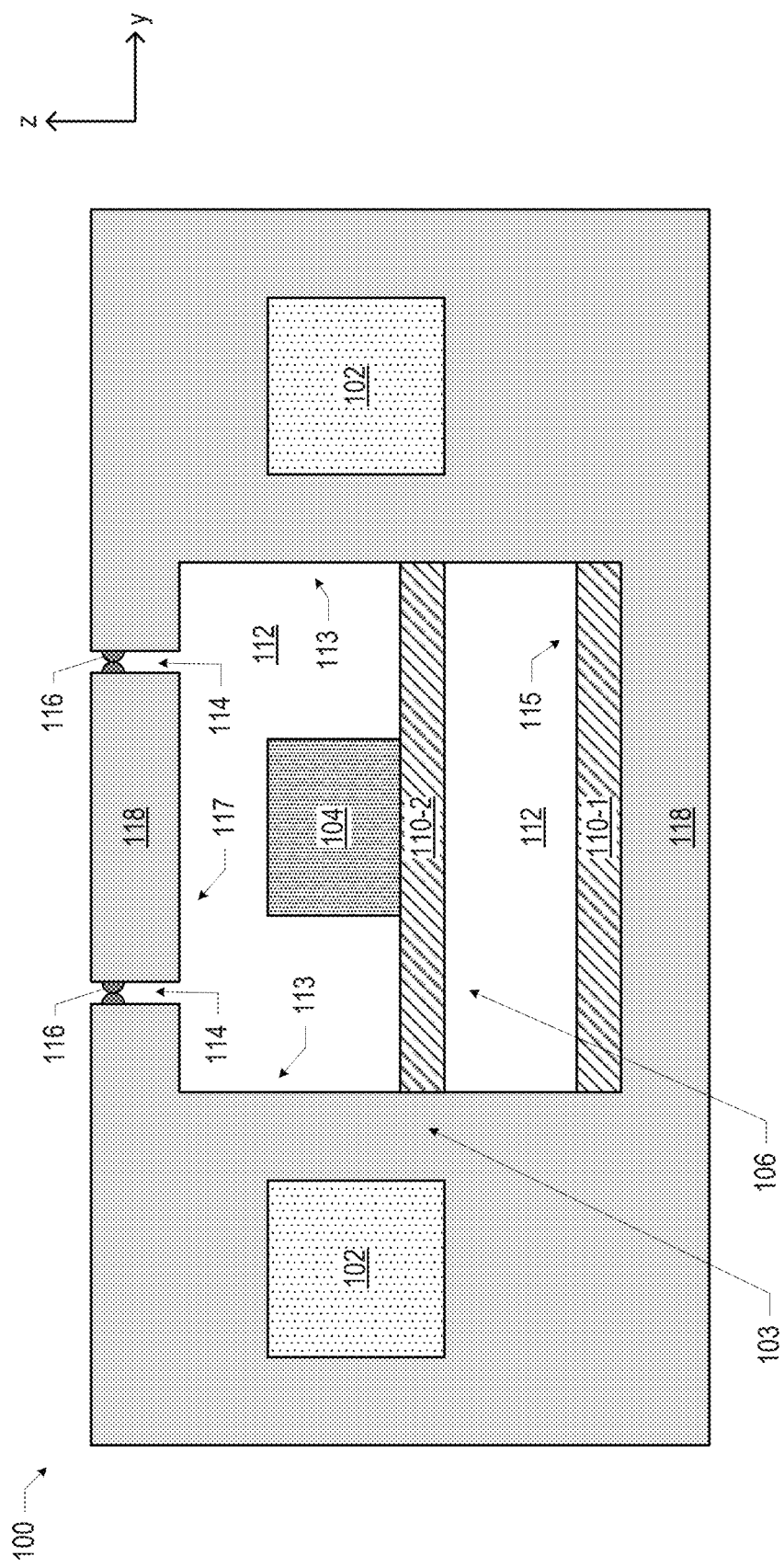
FIG. 2 is a side cross-sectional view of another example inductor/core assembly, in accordance with various embodiments.
Figure 3:
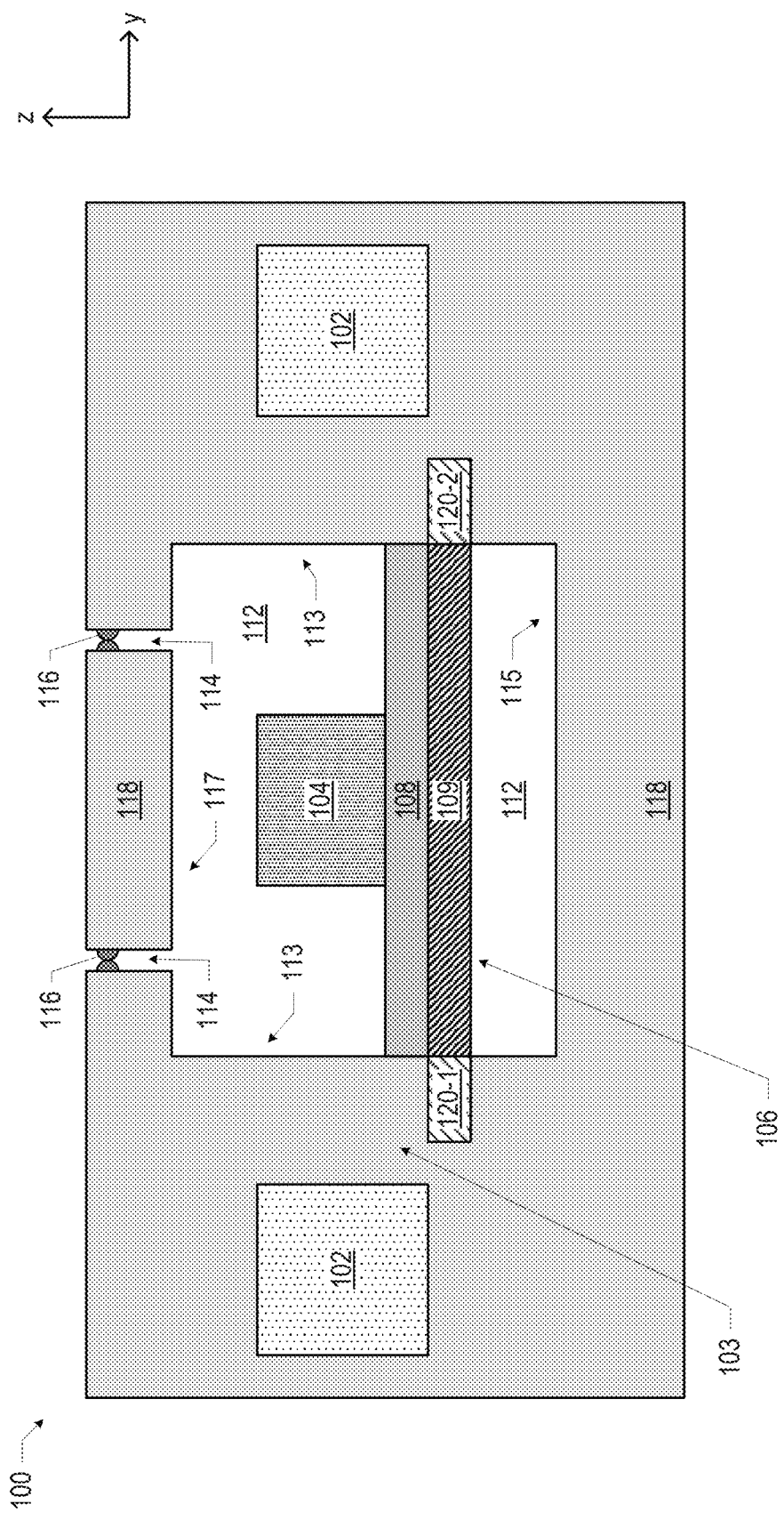
FIG. 3 is a side cross-sectional view of another example inductor/core assembly, in accordance with various embodiments.
Figure 4:
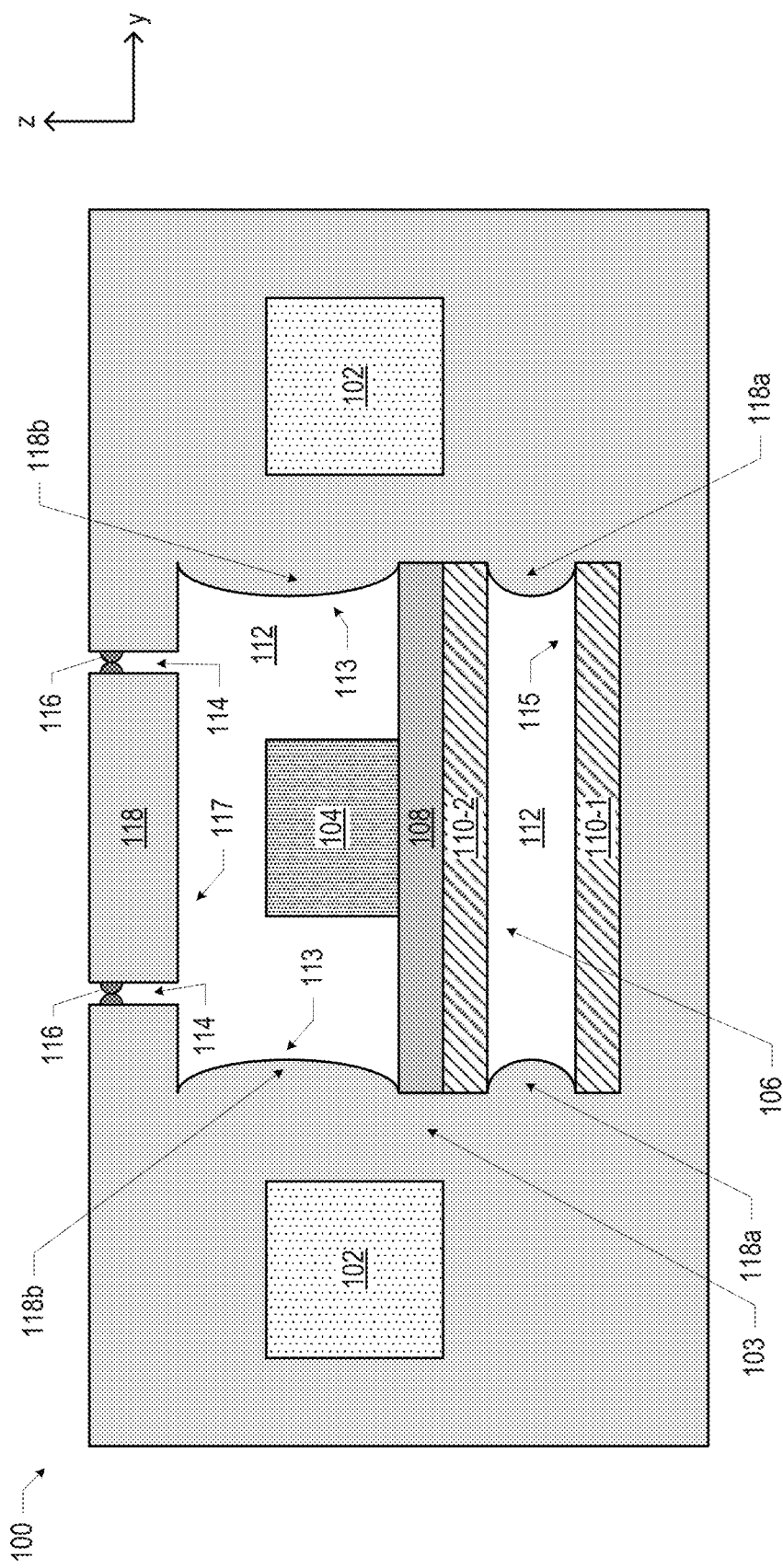
FIG. 4 is a side cross-sectional view of another example inductor/core assembly, in accordance with various embodiments.

FIGS. 2-5 illustrate additional example assemblies 100. Any of the features discussed with reference to any of FIGS. 1-5 herein may be combined with any other features to form an assembly 100. For example, as discussed further below, FIG. 3 illustrates an embodiment in which the beam 106 includes a piezoelectric material 109, and FIG. 4 illustrates an embodiment in which the beam 106 extends into the dielectric material 118. These features of FIGS. 3 and 4 may be combined so that an assembly 100 includes a beam 106 with a piezoelectric material 109 that extends into the dielectric material 118. This particular combination is simply an example, and any combination may be used. A number of elements of FIG. 1 are shared with FIGS. 2-7; for ease of discussion, a description of these elements is not repeated, and these elements may take the form of any of the embodiments disclosed herein. A number of elements of FIG. 1 are shared with FIGS. 2-5; for ease of discussion, a description of these elements is not repeated, and these elements may take the form of any of the embodiments disclosed herein (e.g., as discussed with reference to FIG. 1). For example, the dimensions of any of the elements in FIGS. 2-5 may take the form of any of the dimensions of these elements discussed above with reference to FIG. 1.

As noted above, in some embodiments, a beam 106 may include an electrode material 110-2 and may not include a dielectric material 108. FIG. 2 is a side cross-sectional view of an example of such an assembly 100, in accordance with various embodiments. As illustrated in FIG. 2, the electrode material 110-2 may itself provide the beam 106.

As noted above, different embodiments of the assembly 100 may use different actuation mechanisms to move the magnetic core 104. In some embodiments, the beam 106 may include a piezoelectric material that deforms in response to an applied voltage or current. In such embodiments, the assembly 100 may include electrodes to provide such voltages or currents to the piezoelectric beam 106 to cause a desired deformation. For example, FIG. 3 is a side cross-sectional view of an assembly 100 including a beam 106 having a piezoelectric material 109. A dielectric material 108 may be disposed on the piezoelectric material 109 such that the dielectric material 108 is between the magnetic core 104 and the piezoelectric material 109; in other embodiments, the dielectric material 108 may be omitted. The assembly 100 may include electrode materials 120-1 and 120-2 proximate to opposing ones of the walls 113 and positioned in electrical contact with the piezoelectric material 109 so as to be able to deliver a desired electrical signal to the piezoelectric material 109. As noted above with reference to FIG. 1, for ease of illustration, FIG. 3 does not explicitly illustrate conductive pathways to the electrode materials 120 that may be used to provide the desired electrical signals to the electrode materials 120. The assembly 100 may include such pathways, which themselves may include conductive lines and/or conductive vias, as discussed below with reference to FIG. 29.

Although two electrode materials 120 are illustrated in FIG. 3 in particular locations, the assembly 100 may include any number and arrangement of electrode materials 120 to cause the piezoelectric material 109 to deform in a desired manner. For example, in some embodiments, electrode materials 120 may "sandwich" the piezoelectric material 109 in the z-direction so that the piezoelectric material 109 is between an electrode material 120-1 and an electrode material 120-2 in the z-direction (not shown). In such an arrangement, a dielectric material 108 may be below the "bottommost" electrode material 120-1, between the electrode material 120-1 and the piezoelectric material 109, between the piezoelectric material 109 and the "topmost" electrode material 120-2, and/or above the electrode material 120-2. In other embodiments, the dielectric material 108 may be omitted.

Examples of materials that may provide the piezoelectric material 109 may include aluminum nitride, zinc oxide, and lead zirconate titanate (PZT), among others. The appropriate electrical signals to be provided to the piezoelectric material 109 may depend on the material composition of the piezoelectric material 109 and the geometric arrangement of the electrode materials 120 and the piezoelectric material 109, as known in the art.

As noted above, in some embodiments, the ends of the beam 106 may be "embedded" in the dielectric material 118. In particular, the beam 106 may extend past the walls 113 of the air gap 112 and into the dielectric material 118. FIG. 4 is a side cross-sectional view of an example of such an assembly 100, in accordance with various embodiments. In particular, FIG. 4 illustrates portions of the dielectric material 118 (labeled "118a") between the beam 106 and the floor 115 of the air gap 112 and portions of the dielectric material 118 (labeled "118b") between the beam 106 and the ceiling 117 of the air gap 112. These portions 118a and 118b may help mechanically secure the beam 106 in the assembly 100.

Figure 5A:
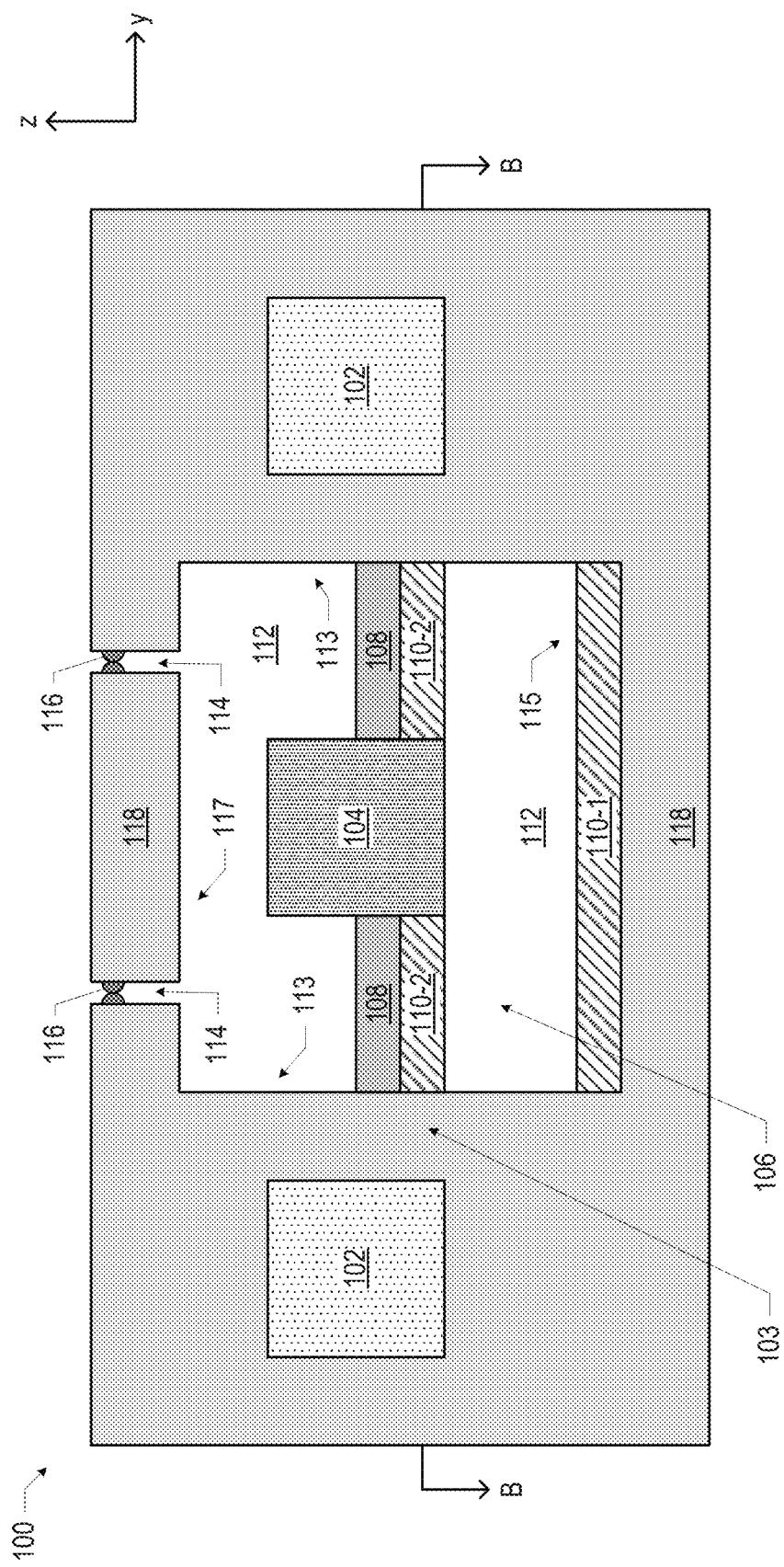
FIGS. 5A-5B are various views of another example inductor/core assembly, in accordance with various embodiments.
Figure 5B:
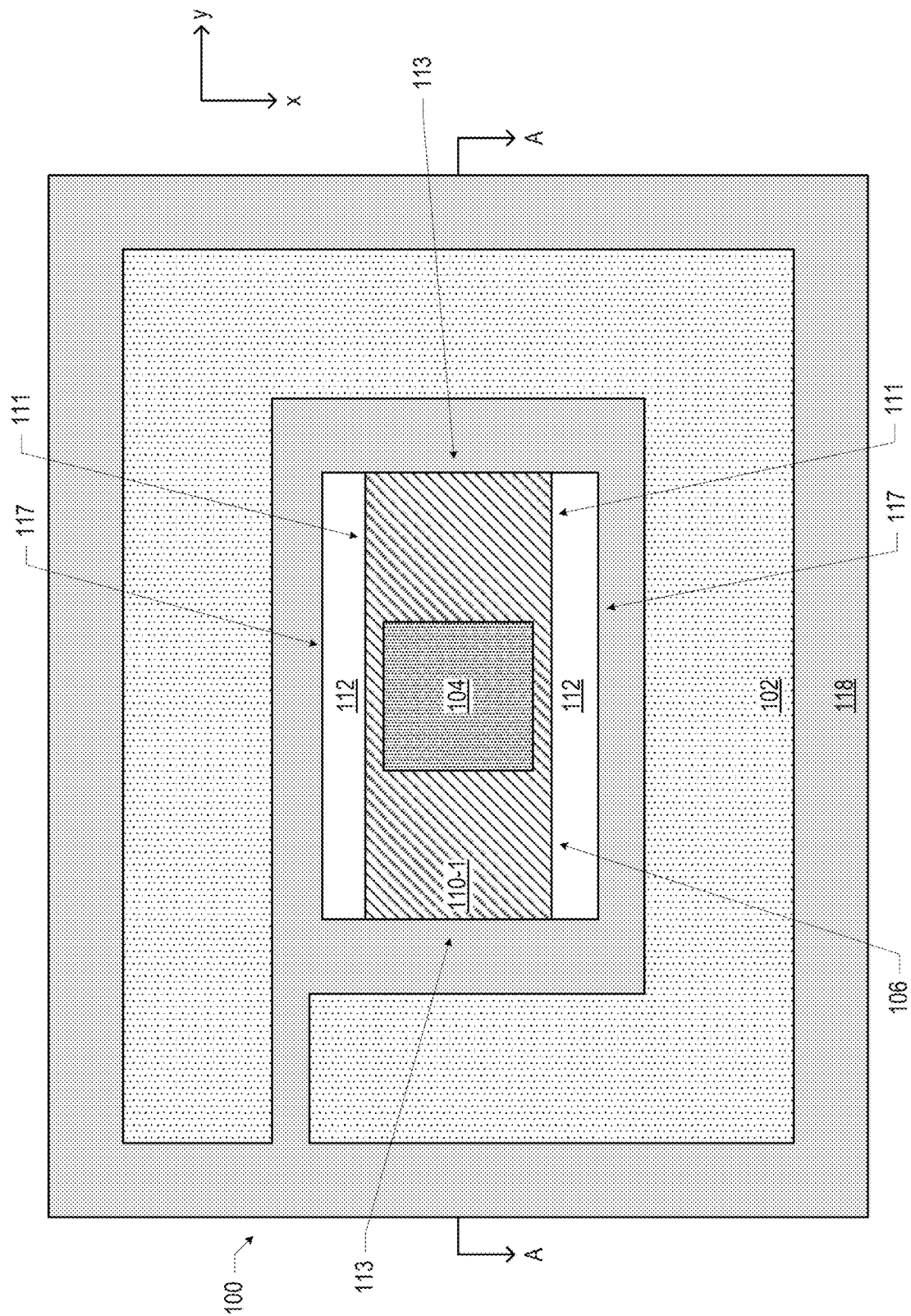

As noted above, in some embodiments, the magnetic core 104 may be at least partially coplanar with the beam 106. FIG. 5 provides various views of an example of such an assembly 100, in accordance with various embodiments. In particular, FIG. 5A is a side cross-sectional view of the assembly 100 (through the section A-A of FIG. 56), and FIG. 5B is a top cross-sectional view (through the section B-B of FIG. 5A). In the embodiment of FIG. 5, one portion of the beam 106 extends between one wall 113 and the magnetic core 104, and another portion of the beam 106 extends between the other wall 113 and the magnetic core 104. In some embodiments, the magnetic core 104 may be partially embedded in the beam 106; for example, the magnetic core 104 may be disposed on a top surface of the electrode material 110-2 and may be embedded in the dielectric material 108.

Figure 6:
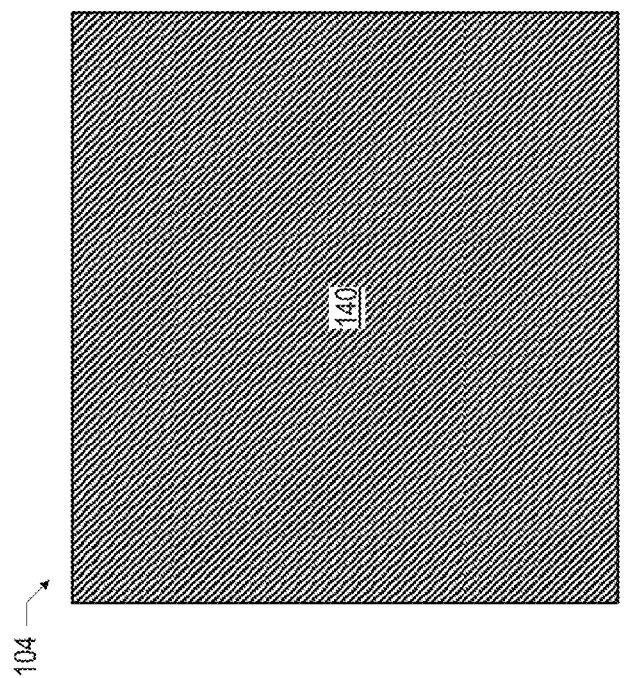
FIG. 6 is a side cross-sectional view of an example magnetic core, in accordance with various embodiments.

The magnetic cores 104 may take any suitable form. For example, FIG. 6 is a side cross-sectional view of an example magnetic assembly that may be used as a magnetic core 104, in accordance with various embodiments. The magnetic core 104 of FIG. 6 may have a substantially homogeneous composition of a magnetic material 140. In some embodiments, the magnetic material 140 may be a ferromagnetic material (e.g., cobalt iron). The dimensions of the magnetic core 104 of FIG. 6 may take the form of any of the embodiments discussed above.

Figure 7B:
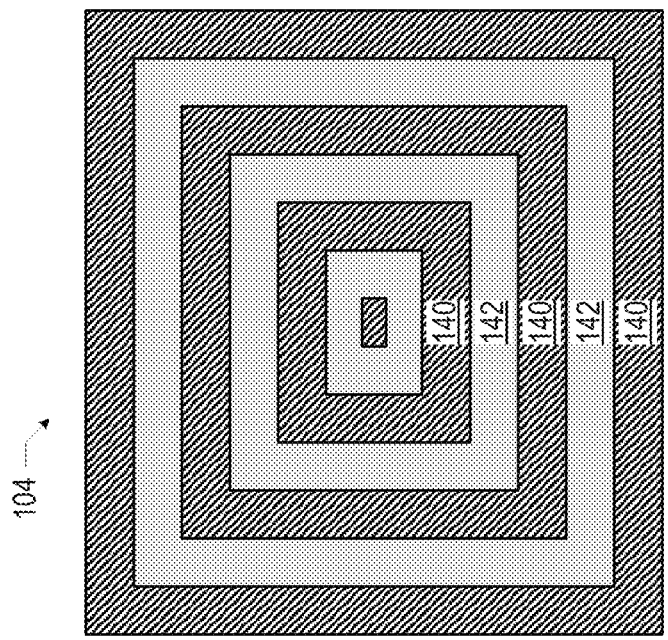
FIGS. 7A-7B are various views of another example magnetic core, in accordance with various embodiments.
Figure 7A:
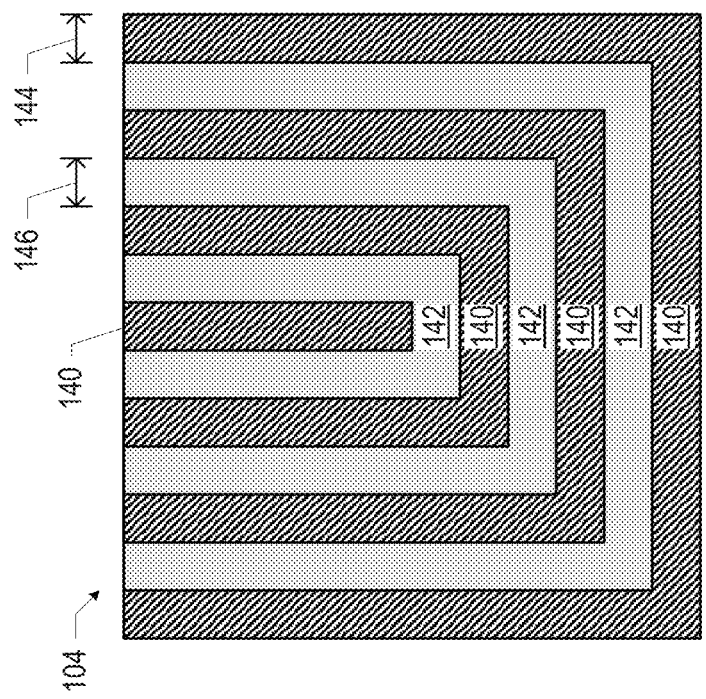

FIG. 7 provides various views of another example magnetic assembly that may be used as a magnetic core 104, in accordance with various embodiments. In particular, FIG. 7A is a side cross-sectional view of the magnetic core 104 (through the section A-A of FIG. 7B), and FIG. 7B is a top view of the magnetic core 104. The magnetic core 104 of FIG. 7 may include alternating layers of a magnetic material 140 and a dielectric material 142. As discussed below with reference to FIG. 26, the magnetic core 104 FIG. 7 may be formed by alternating between conformally depositing a layer of the magnetic material 140 in a cavity (e.g., in a sacrificial material, as discussed below) and conformally depositing a layer of the dielectric material 142 in the cavity. The magnetic material 140 of FIG. 7 may include any suitable magnetic material, such as any of the magnetic materials disclosed herein (e.g., a ferromagnetic material). The dielectric material 142 may include any suitable dielectric material, such as an oxide (e.g., silicon oxide) or a nitride (e.g., silicon nitride). In some embodiments, the thickness 144 of a layer of the magnetic material 140 may be between 100 nanometers and 400 nanometers (e.g., between 200 nanometers and 300 nanometers). In some embodiments, the thickness 146 of a layer of the dielectric material 142 may be less than 100 nanometers (e.g., between 5 nanometers and 75 nanometers). In some embodiments, the thicknesses 144 of different ones of the layers of the magnetic material 140 may be substantially the same, while in other embodiments, the thicknesses 144 of different ones of the layers of the magnetic material 140 may be different. Similarly, in some embodiments, the thicknesses 146 of different ones of the layers of the dielectric material 142 may be substantially the same, while in other embodiments, the thicknesses 146 of different ones of the layers of the dielectric material 142 may be different.

The assemblies 100 and magnetic cores 104 disclosed herein may be formed using any suitable techniques. For example, FIGS. 8-19 illustrate stages in an example process of manufacturing the inductor/core assembly 100 of FIG. 1, in accordance with various embodiments.

Figure 8:
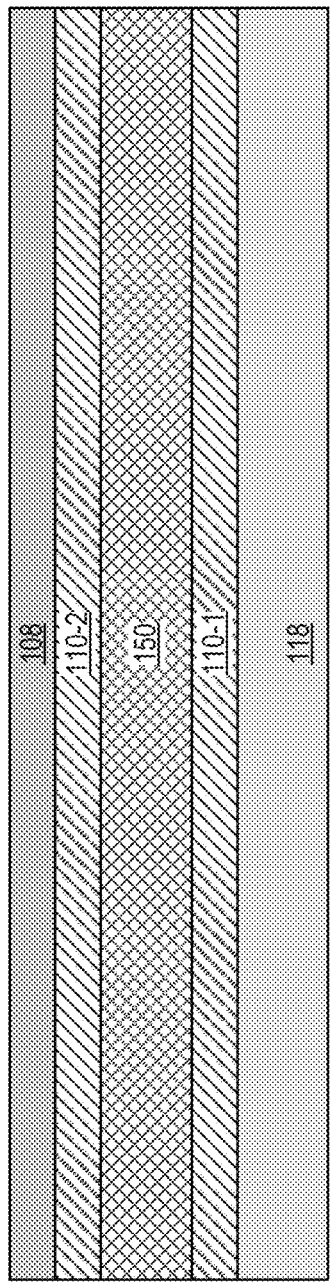

FIG. 8 is a side cross-sectional view of an assembly 200. The assembly 200 includes a layer of dielectric material 118, a layer of electrode material 110-1, a layer of sacrificial material 150, a layer of electrode material 110-2, and a layer of dielectric material 108. The sacrificial material 150 may include any material suitable for patterning and eventual removal, as discussed below. For example, in some embodiments, the sacrificial material 150 may include silicon, oxygen (e.g., in the form of silicon oxide), titanium, nitrogen (e.g., in the form of titanium nitride), or another material. In some embodiments, the sacrificial material 150 may be a wet etchable material. The sacrificial material 150 may have a different material composition than the other elements in the assembly 200, to facilitate selective removal as discussed below.

Figure 9A:
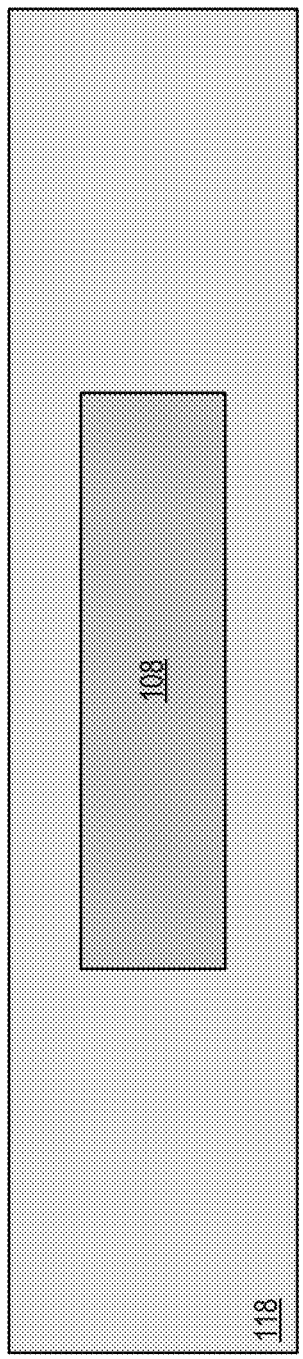
Figure 9B:
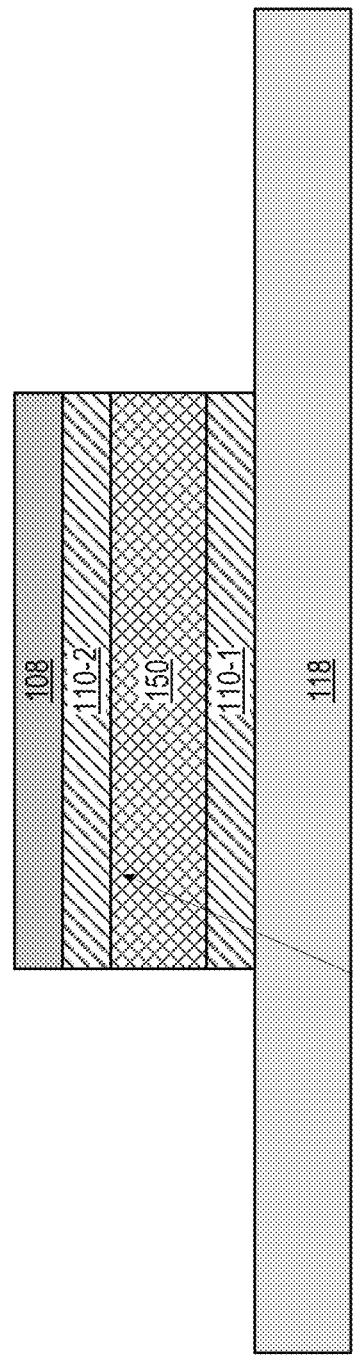

FIG. 9 provides various views of an assembly 202 subsequent to patterning the layers of material on the dielectric material 118 in the assembly 200 (FIG. 8). In particular, FIG. 9A is a top view of the assembly 202, and FIG. 9B is a side cross-sectional view of the assembly 202. The electrode material 110-1, the sacrificial material 150, the electrode material 110-2, and the dielectric material 108 may be patterned substantially simultaneously using any suitable technique (e.g., any suitable lithographic technique).

FIG. 10 provides various views of an assembly 204 subsequent to providing additional sacrificial material 150 on the assembly 202 (FIG. 9). The additional sacrificial material 150 may be blanket deposited on the assembly 202 and then patterned as illustrated in FIG. 10.

FIG. 11 is a side cross-sectional view of an assembly 206 subsequent to providing additional dielectric material 118 on the assembly 204 (FIG. 10). In some embodiments, the additional dielectric material 118 may be blanket deposited and then polished back (e.g., using a chemical mechanical planarization technique) to yield the assembly 206.

FIG. 12 is a side cross-sectional view of an assembly 208 subsequent to forming a trench 107 in the dielectric material 118 of the assembly 206 (FIG. 11). The trench 107 may have the shape of the inductor 102, as discussed further below. Any suitable etch technique may be used to form the trench 107.

FIG. 13 is a side cross-sectional view of an assembly 210 subsequent to depositing a conductive material in the trench 107 of the assembly 208 (FIG. 12) to form the inductor 102. In some embodiments, the conductive material may be blanket deposited over the assembly 208, and then the excess conductive material may be polished back to form the inductor 102.

FIG. 14 is a side cross-sectional view of an assembly 212 subsequent to forming a cavity 105 in the exposed sacrificial material 150 of the assembly 210 (FIG. 13). The cavity 105 may expose the dielectric material 108 and may have the shape of the magnetic core 104, as discussed further below. Any suitable etch technique may be used to form the cavity 105.

Figure 15:
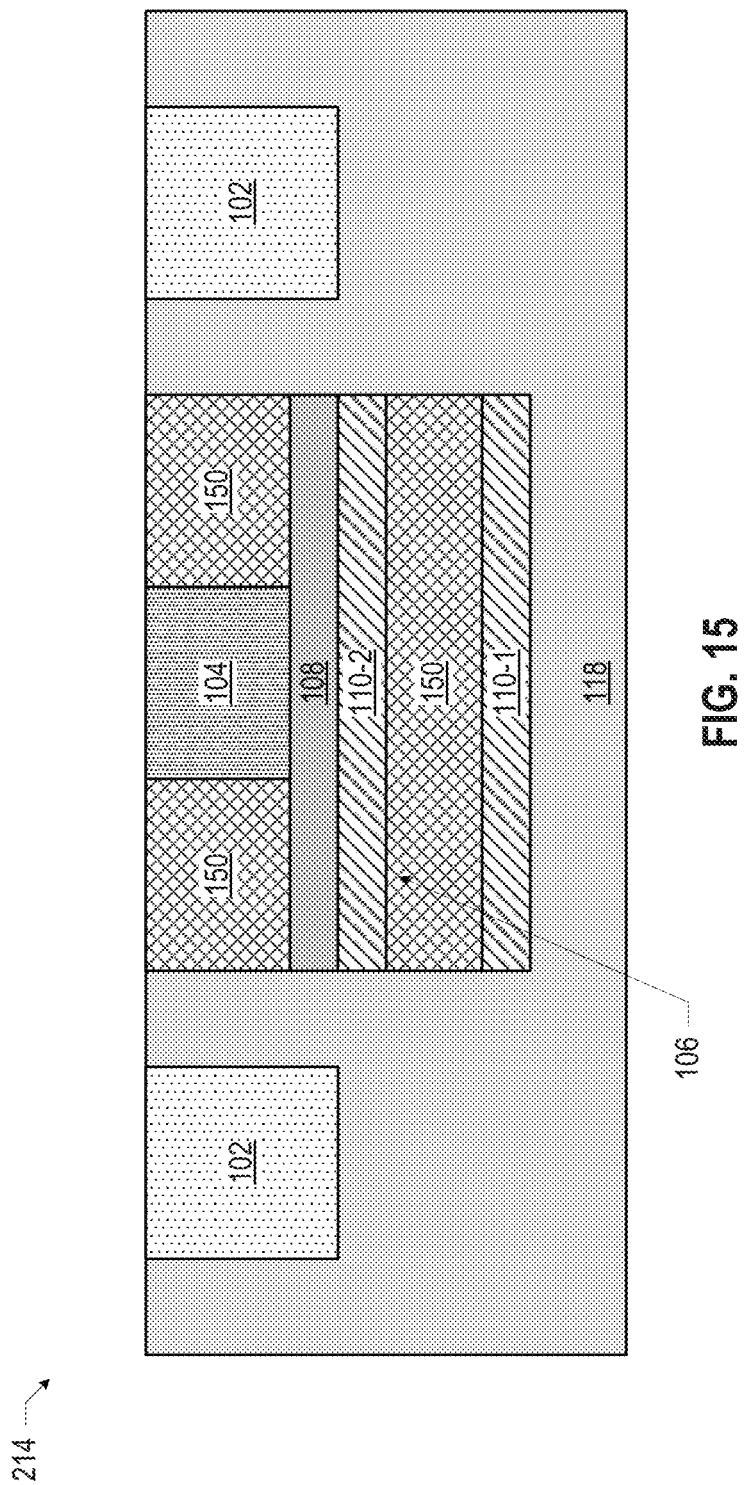

FIG. 15 is a side cross-sectional view of an assembly 214 subsequent to forming a magnetic core 104 in the cavity 105 of the assembly 212 (FIG. 14). In some embodiments, a magnetic material 140 may be blanket deposited over the assembly 212 and then polished back to form the magnetic core 104 (e.g., the magnetic core 104 of FIG. 6). In some embodiments, alternating layers of magnetic material 140 and dielectric material 142 may be deposited over the assembly 212 (e.g., by atomic layer deposition), and the overburden may be polished back to form the magnetic core 104 (e.g., the magnetic core 104 of FIG. 7).

Figure 16:
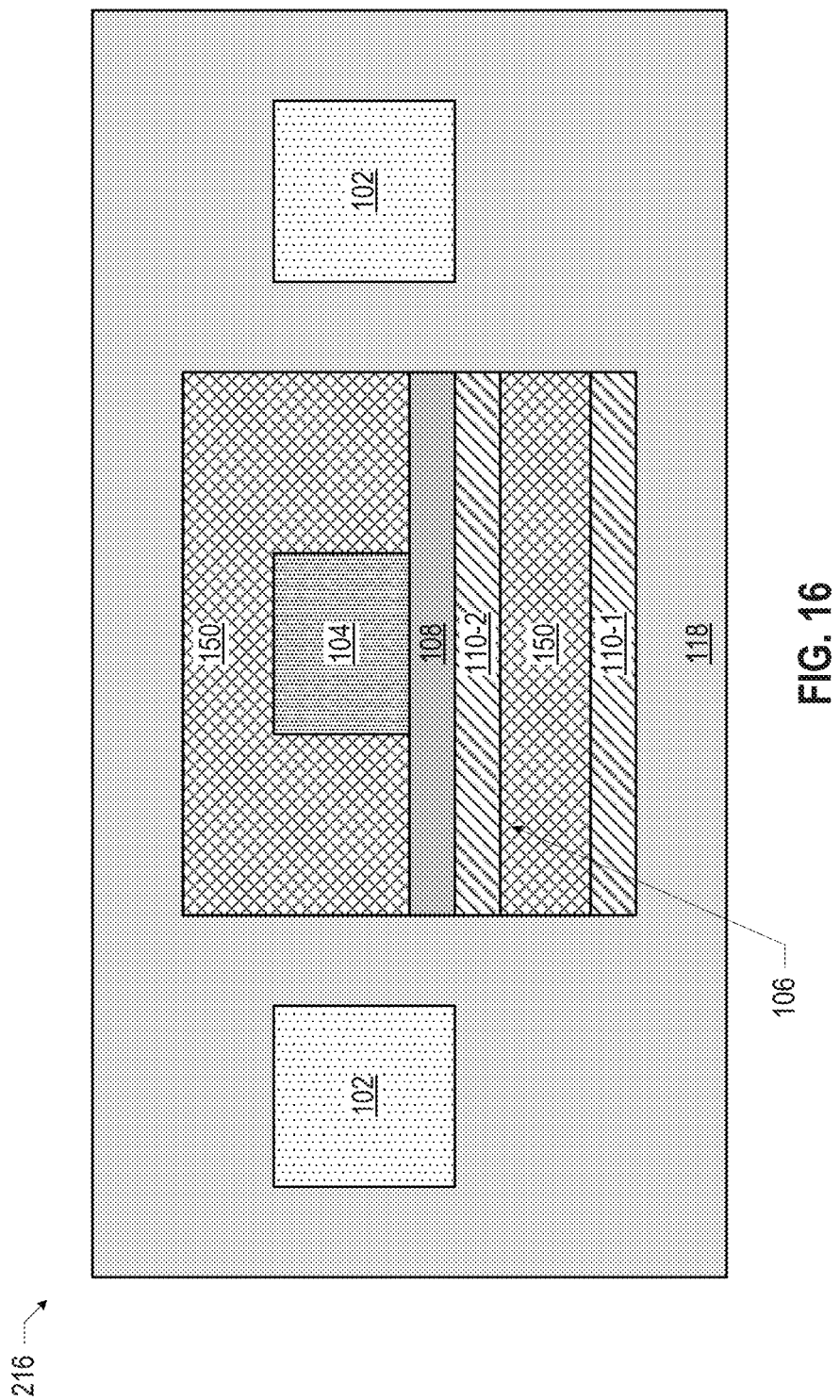

FIG. 16 is a side cross-sectional view of an assembly 216 subsequent to providing additional dielectric material 118 and additional sacrificial material 150 on the assembly 214 (FIG. 15). The additional sacrificial material 150 may be disposed over the magnetic core 104, and at least some of the additional dielectric material 118 may be disposed over the additional sacrificial material 150, as shown.

Figure 17:
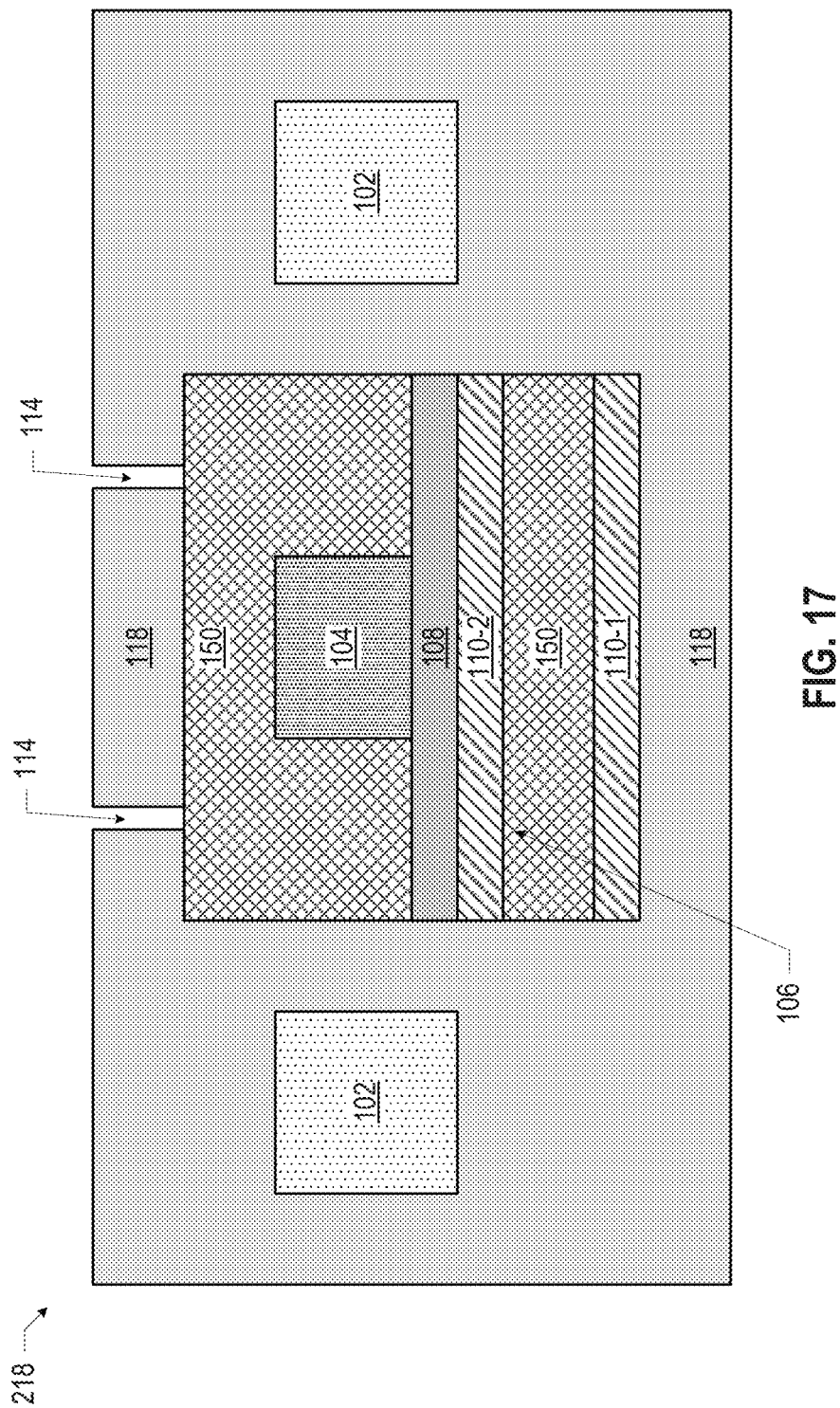

FIG. 17 is a side cross-sectional view of an assembly 218 subsequent to forming inlets 114 in the dielectric material 118 of the assembly 216 (FIG. 16). The inlets 114 may expose portions of the sacrificial material 150. The inlets 114 may be formed using any suitable technique (e.g., an etch technique or a laser drilling technique).

Figure 18:
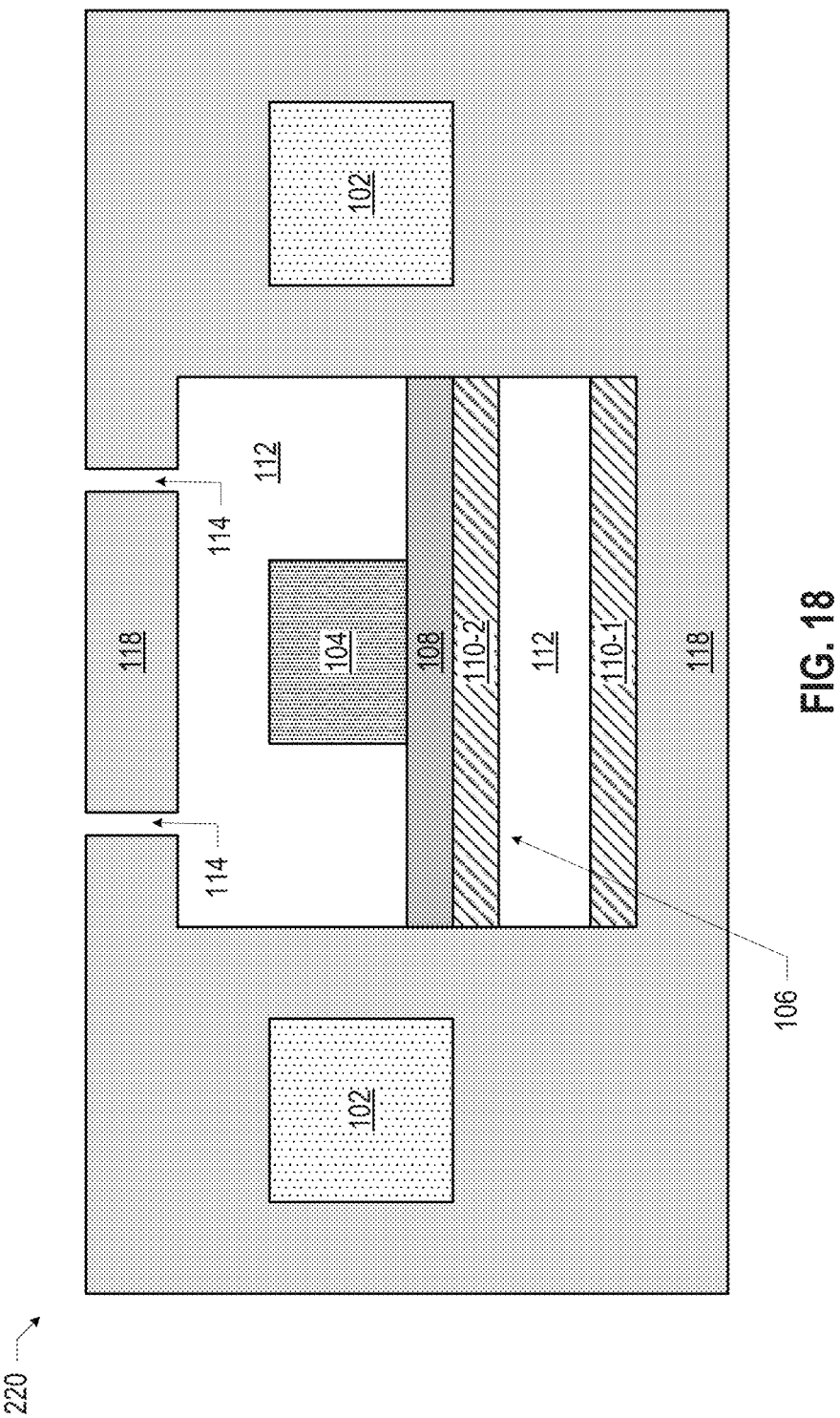

FIG. 18 is a side cross-sectional view of an assembly 220 subsequent to removing the sacrificial material 150 from the assembly 218 (FIG. 17) to form an air gap 112. The sacrificial material 150 may be removed using any suitable process, such as one or more wet etches (e.g., a hydrofluoric acid-(HF) or peroxide-based cleanse). In some embodiments, the air gap 112 may be filled with a desired fluid or may be evacuated.

Figure 19:
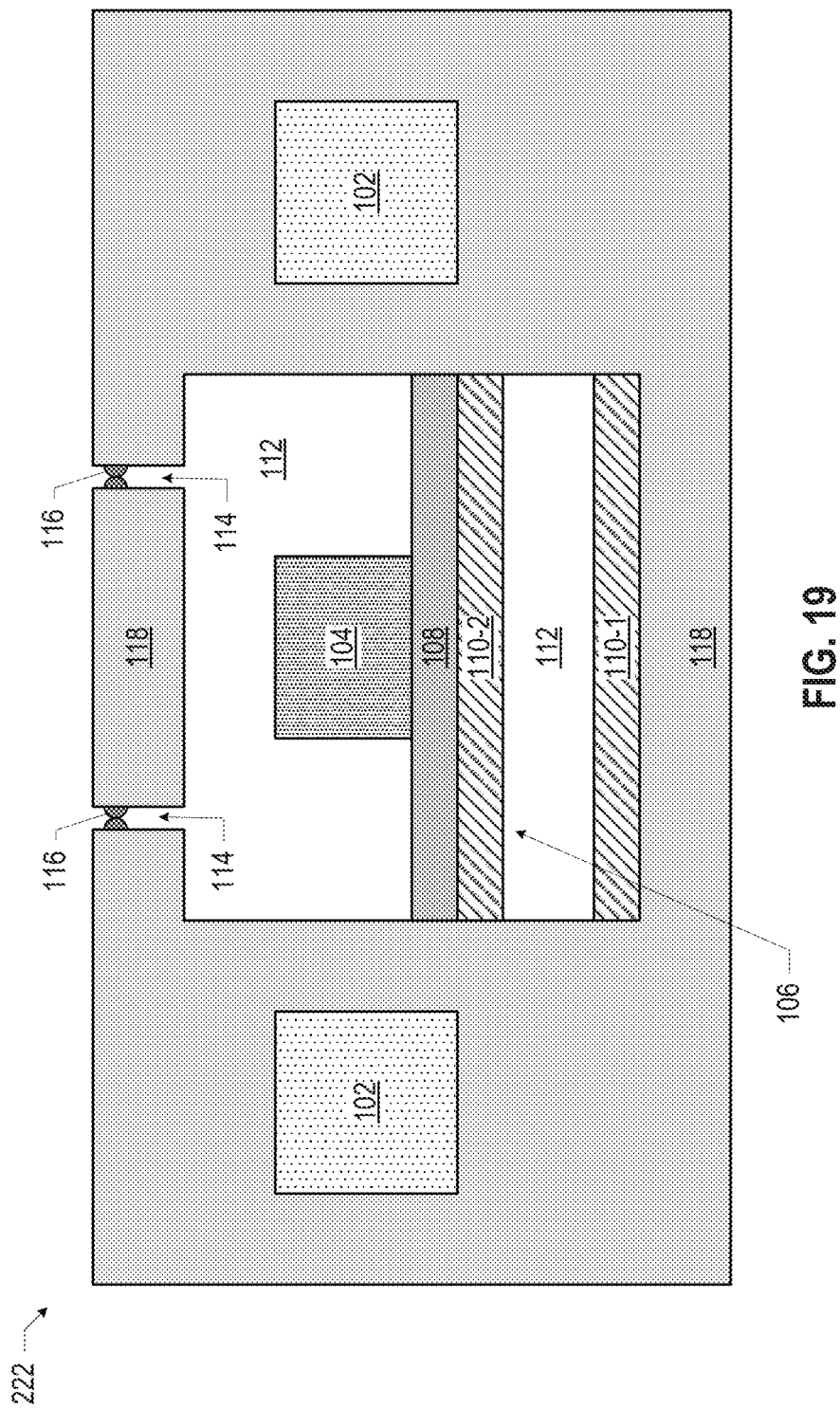

FIG. 19 is a side cross-sectional view of an assembly 222 subsequent to providing a seal material 116 in the inlets 114 of the assembly 220 (FIG. 18) to seal the air gap 112. In some embodiments, the seal material 116 may be provided by physical vapor deposition or chemical vapor deposition. In some embodiments, the seal material 116 may be deposited on assembly 220 so as to cause the seal material 116 on the top interior walls of the inlets 114 to "neck" or "breadloaf" together and seal the inlets 114. The assembly 222 may take the form of the assembly 100 of FIG. 1. In some embodiments, no seal material 116 may be included; subsequent layers of dielectric material 118 (not shown) may seal the air gap 112.

Example manufacturing process illustrated in FIGS. 8-19 may be modified to manufacture other ones of the assemblies 100 disclosed herein. For example, the assembly 100 of FIG. 2 may be formed by omitting the layer of dielectric material 108 from the assembly 200 of FIG. 8.

Figure 20:
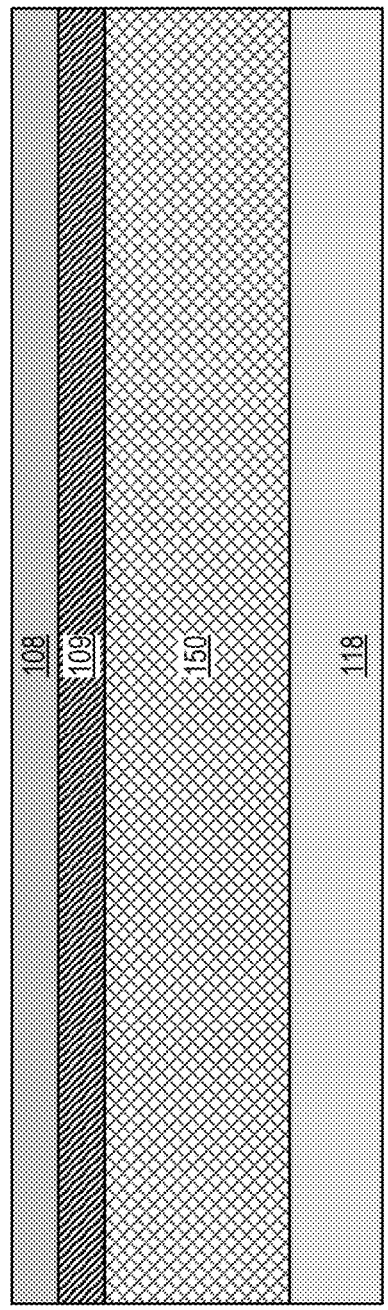
FIG. 20 illustrates a stage in an example process of manufacturing the inductor/core assembly of FIG. 3, in accordance with various embodiments.

FIG. 20 illustrates an assembly 224 that may serve as a starting point for the manufacture of the assembly 100 of FIG. 3. The assembly 224 includes a layer of dielectric material 118, a layer of sacrificial material 150, a layer of piezoelectric material 109, and a layer of dielectric material 108. The assembly 224 may be processed as discussed above with reference to FIGS. 9-19, with the electrode materials 120 formed before or after the inductor 102, using techniques similar to those discussed above with reference to the inductor 102.

Figure 21:
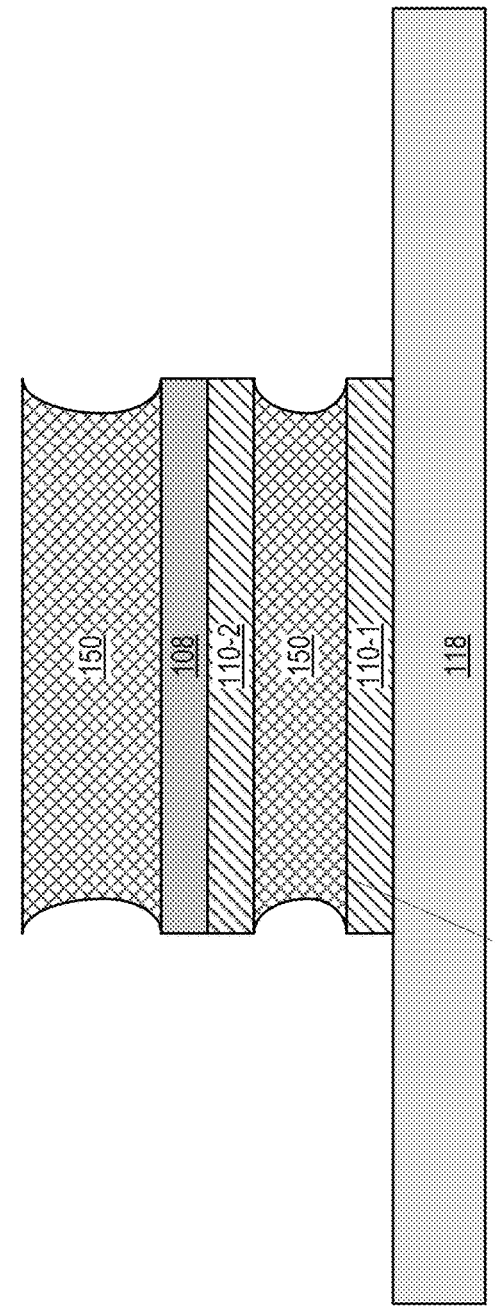
FIGS. 21-22 illustrate stages in an example process of manufacturing the inductor/core assembly of FIG. 4, in accordance with various embodiments.
Figure 22:
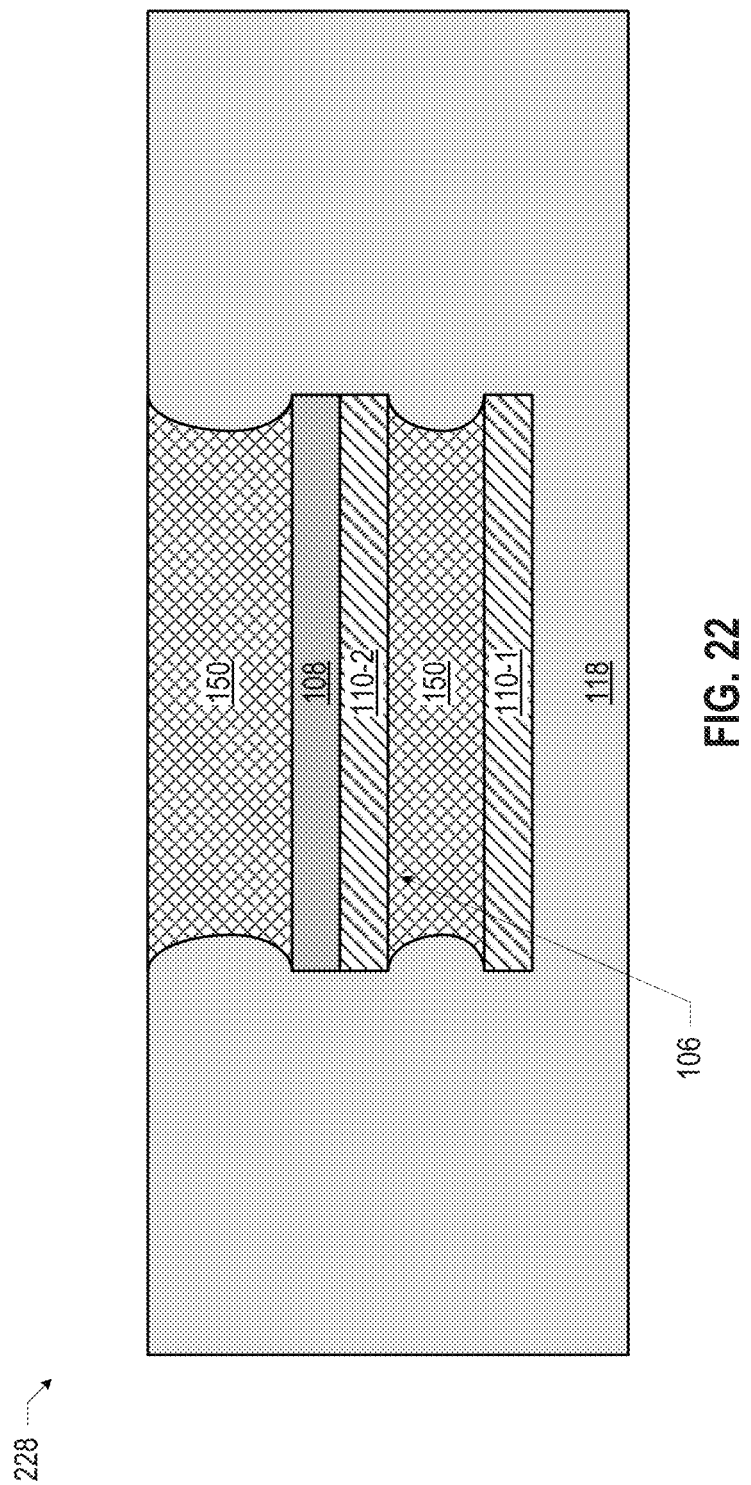

The assembly 100 of FIG. 4 may be formed by starting with the operations discussed above with reference to FIGS. 8-10. An isotropic etch may be performed on the assembly 204 of FIG. 10 to yield the assembly 226 illustrated in FIG. 21. The isotropic etch may be selective to the sacrificial material 150 and may remove some of the perimeter portions of the sacrificial material 150. In some embodiments, a top surface of the sacrificial material 150 may be protected by a hardmask or other protective layer (not shown) during the etch. The assembly 226 may then be processed as discussed above with reference to FIG. 11 to form the assembly 228 of FIG. 22. The assembly 228 may then be processed as discussed above with reference to FIGS. 12-19 to form the assembly 100 of FIG. 4.

Figure 23:
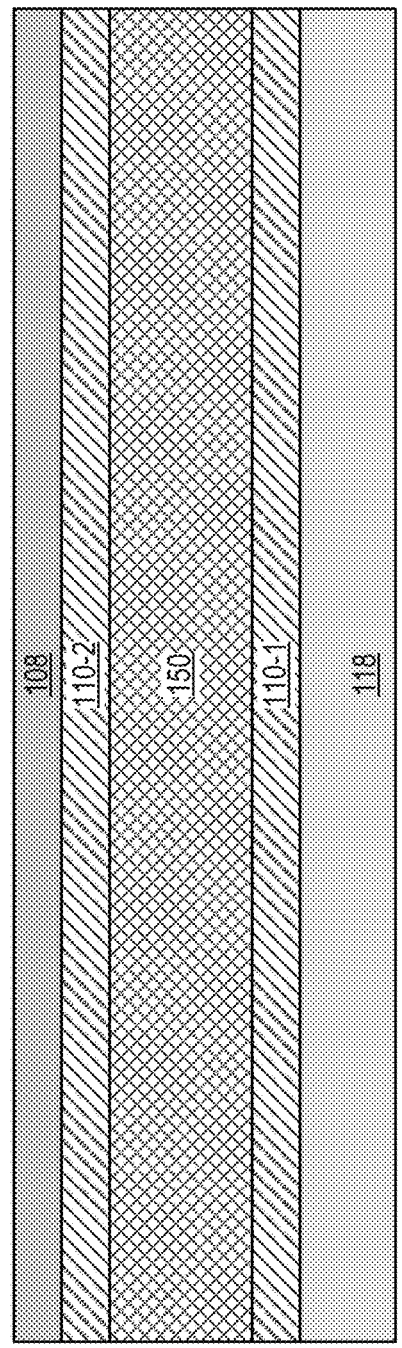
FIGS. 23-24 illustrate stages in an example process of manufacturing the inductor/core assembly of FIG. 5, in accordance with various embodiments.
Figure 24:
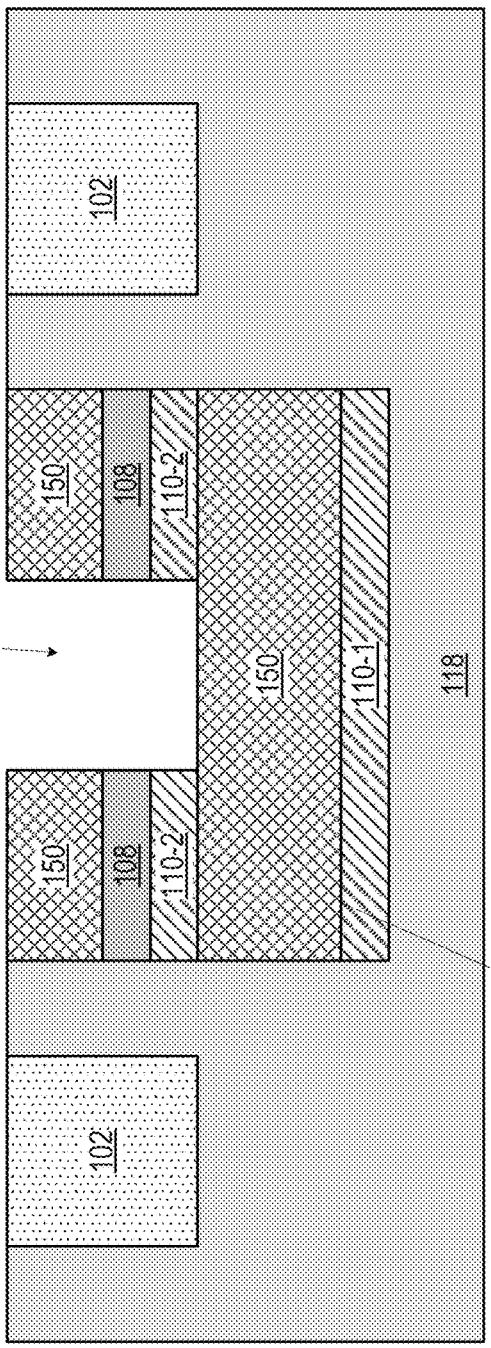

FIG. 23 illustrates an assembly 230 that may serve as a starting point for the manufacture of the assembly 100 of FIG. 5. The assembly 230 includes a layer of dielectric material 118, a layer of electrode material 110-1, a layer of sacrificial material 150, a layer of electrode material 110-2, and a layer of dielectric material 108. The assembly 230 may be processed as discussed above with reference to FIGS. 9-13, but instead of the cavity 105 "bottoming out" on the dielectric material 108 (as discussed above with reference to FIG. 14), the cavity 105 may extend through the dielectric material 108 and the electrode material 110-2 to form the assembly 232 of FIG. 24. The assembly 232 may then be processed as discussed above with reference to FIGS. 15-19 to form the assembly 100 of FIG. 5.

Figure 25:
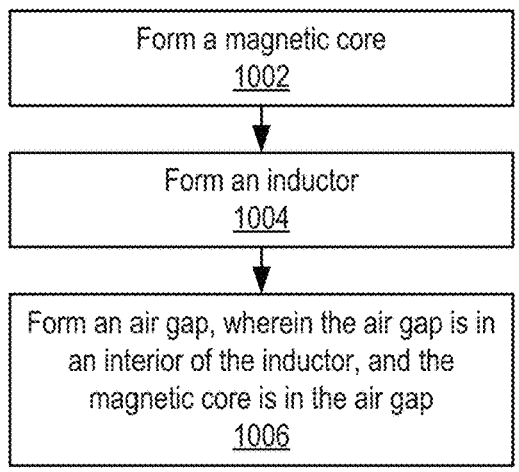
FIG. 25 is a flow diagram of a method of manufacturing an inductor/core assembly, in accordance with various embodiments.

As noted above, any suitable techniques may be used to manufacture the assemblies 100 disclosed herein. FIG. 25 is a flow diagram of a method 1000 of manufacturing an inductor/core assembly, in accordance with various embodiments. Although the operations of the method 1000 may be illustrated with reference to particular embodiments of the inductor/core assemblies 100 disclosed herein, the method 1000 may be used to form any suitable inductor/core assembly. Operations are illustrated once each and in a particular order in FIG. 25, but the operations may be reordered and/or repeated as desired (e.g., with different operations performed in parallel when manufacturing multiple electronic components simultaneously).

At 1002, a magnetic core may be formed. For example, the magnetic core 104 may be formed in accordance with any of the embodiments discussed above (e.g., with reference to FIGS. 6, 7, and 15).

At 1004, an inductor may be formed. For example, an inductor 102 may be formed in accordance with any of the embodiments discussed above (e.g., with reference to FIG. 13).

At 1006, an air gap may be formed. The air gap may be in an interior of the inductor, and the magnetic core may be in the air gap. For example, an air gap 112 may be formed. The air gap 112 may be in an interior 103 of the inductor 102, and the magnetic core 104 may be in the air gap 112. The air gap 112 may be formed in accordance with any of the embodiments discussed above (e.g., with reference to FIG. 18).

Figure 26:
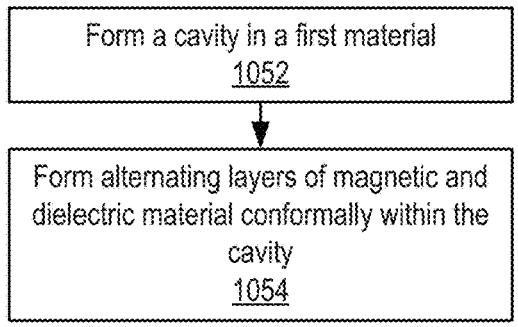
FIG. 26 is a flow diagram of a method of manufacturing a magnetic core, in accordance with various embodiments.

Any suitable techniques may be used to manufacture the magnetic cores 104 disclosed herein. FIG. 26 is a flow diagram of a method 1050 of manufacturing a magnetic core, in accordance with various embodiments. Although the operations of the method 1050 may be illustrated with reference to particular embodiments of the magnetic cores 104 disclosed herein, the method 1050 may be used to form any suitable magnetic core. Operations are illustrated once each and in a particular order in FIG. 26, but the operations may be reordered and/or repeated as desired (e.g., with different operations performed in parallel when manufacturing multiple electronic components simultaneously).

At 1502, a cavity may be formed in a first material. For example, the cavity 105 may be formed in a sacrificial material 150 (e.g., as discussed above with reference to FIG. 14).

At 1504, alternating layers of magnetic and dielectric material may be formed conformally within the cavity. For example, alternating layers of magnetic material 140 and dielectric material 142 may be deposited by atomic layer deposition within the cavity 105 (e.g., as discussed above with reference to FIGS. 7 and 15).

Figure 27:
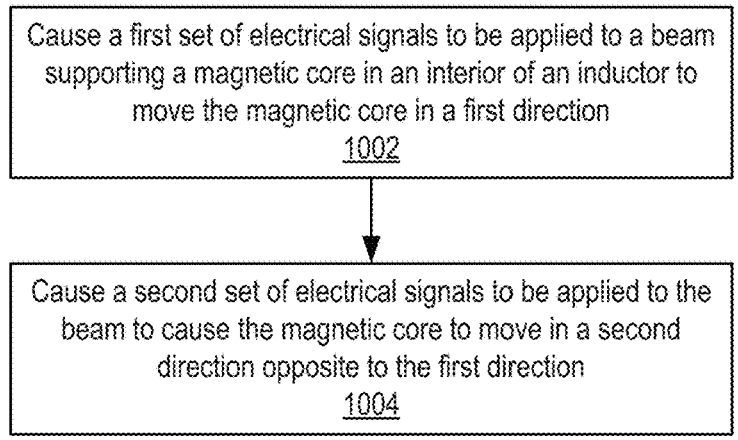
FIG. 27 is a flow diagram of a method of operating an inductor/core assembly, in accordance with various embodiments.

FIG. 27 is a flow diagram of a method 1100 of operating an inductor/core assembly, in accordance with various embodiments. Although the operations of the method 1100 may be illustrated with reference to particular embodiments of the inductor/core assemblies 100 disclosed herein, the method 1100 may be used to operate any suitable inductor/core assembly. Operations are illustrated once each and in a particular order in FIG. 27, but the operations may be reordered and/or repeated as desired (e.g., with different operations performed in parallel when operating multiple electronic components simultaneously).

At 1102, a first set of electrical signals may be caused to be applied to a beam. The beam may support a magnetic core in an interior of an inductor, and the first set of electrical signals may cause the magnetic core to move in a first direction. For example, control signals may be sent to control circuitry to cause the control circuitry to provide voltages and/or currents to the electrode materials 110 and/or the electrode materials 120 to cause the magnetic core 104 to move "up" or "down."

At 1104, a second set of electrical signals may be caused to be applied to the beam. The application of the second set of electrical signals to the beam may cause the magnetic core to move in a second direction opposite to the first direction. For example, control signals may be sent to control circuitry to cause the control circuitry to provide voltages and/or currents to the electrode materials 110 and/electrode materials 120 to cause the magnetic core 104 to move "down" or "up."

The inductor/core assemblies 100 disclosed herein may be included in any suitable electronic component. FIGS. 28-32 illustrate various examples of apparatuses that may include any of the inductor/core assemblies 100 disclosed herein.

Figure 28:
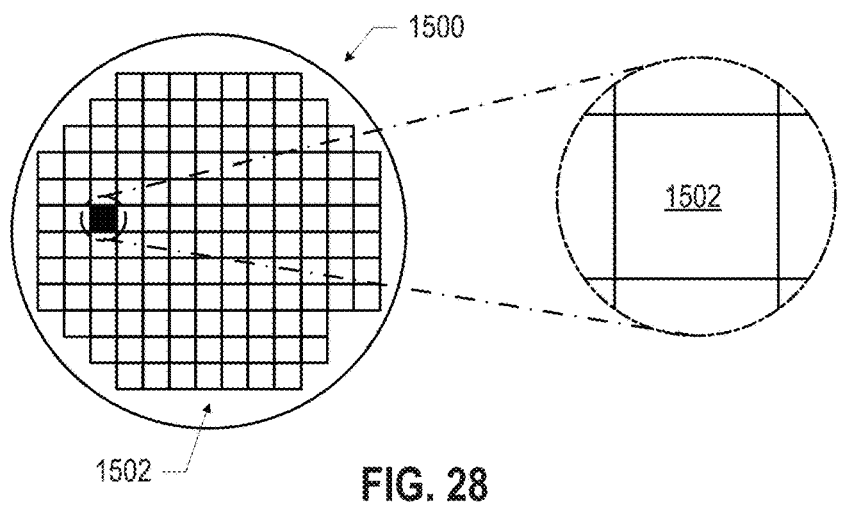
FIG. 28 is a top view of a wafer and dies that may include an inductor/core assembly, in accordance with any of the embodiments disclosed herein.

FIG. 28 is a top view of a wafer 1500 and dies 1502 that may include one or more inductor/core assemblies 100 or may be included in an IC package whose substrate includes one or more inductor/core assemblies 100 (e.g., as discussed below with reference to FIG. 30), in accordance with any of the embodiments disclosed herein. The wafer 1500 may be composed of semiconductor material and may include one or more dies 1502 having IC structures formed on a surface of the wafer 1500. Each of the dies 1502 may be a repeating unit of a semiconductor product that includes any suitable IC. After the fabrication of the semiconductor product is complete, the wafer 1500 may undergo a singulation process in which the dies 1502 are separated from one another to provide discrete "chips" of the semiconductor product. The die 1502 may include one or more inductor/core assemblies 100 (e.g., as discussed below with reference to FIG. 29), one or more transistors (e.g., some of the transistors 1640 of FIG. 29, discussed below), and/or supporting circuitry to route electrical signals to the transistors, as well as any other IC components. In some embodiments, the wafer 1500 or the die 1502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 1502. For example, a memory array formed by multiple memory devices may be formed on a same die 1502 as a processing device (e.g., the processing device 1802 of FIG. 32) or other logic that is configured to store information in the memory devices or execute instructions stored in the memory array.

Figure 29:
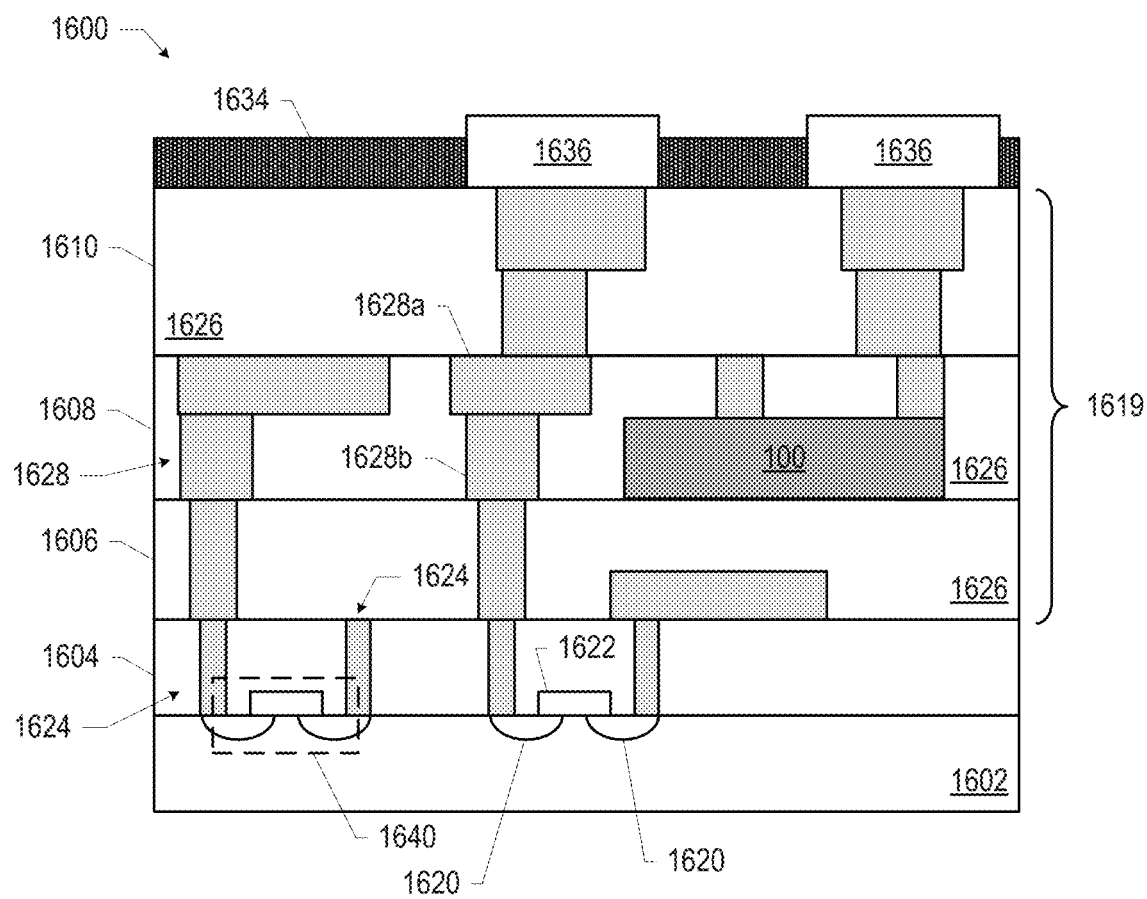
FIG. 29 is a cross-sectional side view of an integrated circuit (IC) device that may include an inductor/core assembly, in accordance with any of the embodiments disclosed herein.

FIG. 29 is a cross-sectional side view of an IC device 1600 that may include one or more inductor/core assemblies 100 or may be included in an IC package whose substrate includes one or more inductor/core assemblies 100 (e.g., as discussed below with reference to FIG. 30), in accordance with any of the embodiments disclosed herein. One or more of the IC devices 1600 may be included in one or more dies 1502 (FIG. 28). The IC device 1600 may be formed on a substrate 1602 (e.g., the wafer 1500 of FIG. 28) and may be included in a die (e.g., the die 1502 of FIG. 28). The substrate 1602 may be a semiconductor substrate composed of semiconductor material systems including, for example, n-type or p-type materials systems (or a combination of both). The substrate 1602 may include, for example, a crystalline substrate formed using a bulk silicon or a silicon-on-insulator (SOI) substructure. In some embodiments, the substrate 1602 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 1602. Although a few examples of materials from which the substrate 1602 may be formed are described here, any material that may serve as a foundation for an IC device 1600 may be used. The substrate 1602 may be part of a singulated die (e.g., the dies 1502 of FIG. 28) or a wafer (e.g., the wafer 1500 of FIG. 28).

The IC device 1600 may include one or more device layers 1604 disposed on the substrate 1602. The device layer 1604 may include features of one or more transistors 1640 (e.g., metal oxide semiconductor field-effect transistors (MOSFETs)) formed on the substrate 1602. The device layer 1604 may include, for example, one or more source and/or drain (S/D) regions 1620, a gate 1622 to control current flow in the transistors 1640 between the S/D regions 1620, and one or more S/D contacts 1624 to route electrical signals to/from the S/D regions 1620. The transistors 1640 may include additional features not depicted for the sake of clarity, such as device isolation regions, gate contacts, and the like. The transistors 1640 are not limited to the type and configuration depicted in FIG. 29 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon and nanowire transistors.

Each transistor 1640 may include a gate 1622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 1640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 1640 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1620 may be formed within the substrate 1602 adjacent to the gate 1622 of each transistor 1640. The S/D regions 1620 may be formed using an implantation/diffusion process or an etching/deposition process, for example. In the former process, dopants such as boron, aluminum, antimony, phosphorous, or arsenic may be ion-implanted into the substrate 1602 to form the S/D regions 1620. An annealing process that activates the dopants and causes them to diffuse farther into the substrate 1602 may follow the ion-implantation process. In the latter process, the substrate 1602 may first be etched to form recesses at the locations of the S/D regions 1620. An epitaxial deposition process may then be carried out to fill the recesses with material that is used to fabricate the S/D regions 1620. In some implementations, the S/D regions 1620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1620 may be formed using one or more alternate semiconductor materials such as germanium or a group III-V material or alloy. In further embodiments, one or more layers of metal and/or metal alloys may be used to form the S/D regions 1620.

Electrical signals, such as power and/or input/output (I/O) signals, may be routed to and/or from the devices (e.g., transistors 1640) of the device layer 1604 through one or more interconnect layers disposed on the device layer 1604 (illustrated in FIG. 29 as interconnect layers 1606-1610). For example, electrically conductive features of the device layer 1604 (e.g., the gate 1622 and the S/D contacts 1624) may be electrically coupled with the interconnect structures 1628 of the interconnect layers 1606-1610. The one or more interconnect layers 1606-1610 may form a metallization stack (also referred to as an "ILD stack") 1619 of the IC device 1600. In some embodiments, one or more inductor/core assemblies 100 may be disposed in one or more of the interconnect layers 1606-1610, in accordance with any of the techniques disclosed herein. FIG. 29 illustrates a single inductor/core assembly 100 in the interconnect layer 1608 for illustration purposes, but any number and structure of inductor/core assemblies 100 may be included in any one or more of the layers in a metallization stack 1619. An inductor/core assembly 100 included in the metallization stack 1619 may be referred to as a "back-end" assembly. In some embodiments, the IC device 1600 may not include any back-end inductor/core assemblies 100. One or more inductor/core assemblies 100 in the metallization stack 1619 may be coupled to any suitable ones of the devices in the device layer 1604 and/or to one or more of the conductive contacts 1636 (discussed below).

The interconnect structures 1628 may be arranged within the interconnect layers 1606-1610 to route electrical signals according to a wide variety of designs; in particular, the arrangement is not limited to the particular configuration of interconnect structures 1628 depicted in FIG. 29. Although a particular number of interconnect layers 1606-1610 is depicted in FIG. 29, embodiments of the present disclosure include IC devices having more or fewer interconnect layers than depicted.

In some embodiments, the interconnect structures 1628 may include lines 1628a and/or vias 1628b filled with an electrically conductive material such as a metal. The lines 1628a may be arranged to route electrical signals in a direction of a plane that is substantially parallel with a surface of the substrate 1602 upon which the device layer 1604 is formed. For example, the lines 1628a may route electrical signals in a direction in and out of the page from the perspective of FIG. 29. The vias 1628b may be arranged to route electrical signals in a direction of a plane that is substantially perpendicular to the surface of the substrate 1602 upon which the device layer 1604 is formed. In some embodiments, the vias 1628b may electrically couple lines 1628a of different interconnect layers 1606-1610 together.

The interconnect layers 1606-1610 may include a dielectric material 1626 disposed between the interconnect structures 1628, as shown in FIG. 29. In some embodiments, the dielectric material 1626 disposed between the interconnect structures 1628 in different ones of the interconnect layers 1606-1610 may have different compositions; in other embodiments, the composition of the dielectric material 1626 between different interconnect layers 1606-1610 may be the same.

A first interconnect layer 1606 (referred to as Metal 1 or "M1") may be formed directly on the device layer 1604. In some embodiments, the first interconnect layer 1606 may include lines 1628a and/or vias 1628b, as shown. The lines 1628a of the first interconnect layer 1606 may be coupled with contacts (e.g., the S/D contacts 1624) of the device layer 1604.

A second interconnect layer 1608 (referred to as Metal 2 or "M2") may be formed directly on the first interconnect layer 1606. In some embodiments, the second interconnect layer 1608 may include vias 1628b to couple the lines 1628a of the second interconnect layer 1608 with the lines 1628a of the first interconnect layer 1606. Although the lines 1628a and the vias 1628b are structurally delineated with a line within each interconnect layer (e.g., within the second interconnect layer 1608) for the sake of clarity, the lines 1628a and the vias 1628b may be structurally and/or materially contiguous (e.g., simultaneously filled during a dual-damascene process) in some embodiments.

A third interconnect layer 1610 (referred to as Metal 3 or "M3") (and additional interconnect layers, as desired) may be formed in succession on the second interconnect layer 1608 according to similar techniques and configurations described in connection with the second interconnect layer 1608 or the first interconnect layer 1606. In some embodiments, the interconnect layers that are "higher up" in the metallization stack 1619 in the IC device 1600 (i.e., further away from the device layer 1604) may be thicker.

The IC device 1600 may include a solder resist material 1634 (e.g., polyimide or similar material) and one or more conductive contacts 1636 formed on the interconnect layers 1606-1610. In FIG. 29, the conductive contacts 1636 are illustrated as taking the form of bond pads. The conductive contacts 1636 may be electrically coupled with the interconnect structures 1628 and configured to route the electrical signals of the transistor(s) 1640 to other external devices. For example, solder bonds may be formed on the one or more conductive contacts 1636 to mechanically and/or electrically couple a chip including the IC device 1600 with another component (e.g., a circuit board). The IC device 1600 may include additional or alternate structures to route the electrical signals from the interconnect layers 1606-1610; for example, the conductive contacts 1636 may include other analogous features (e.g., posts) that route the electrical signals to external components.

Figure 30:
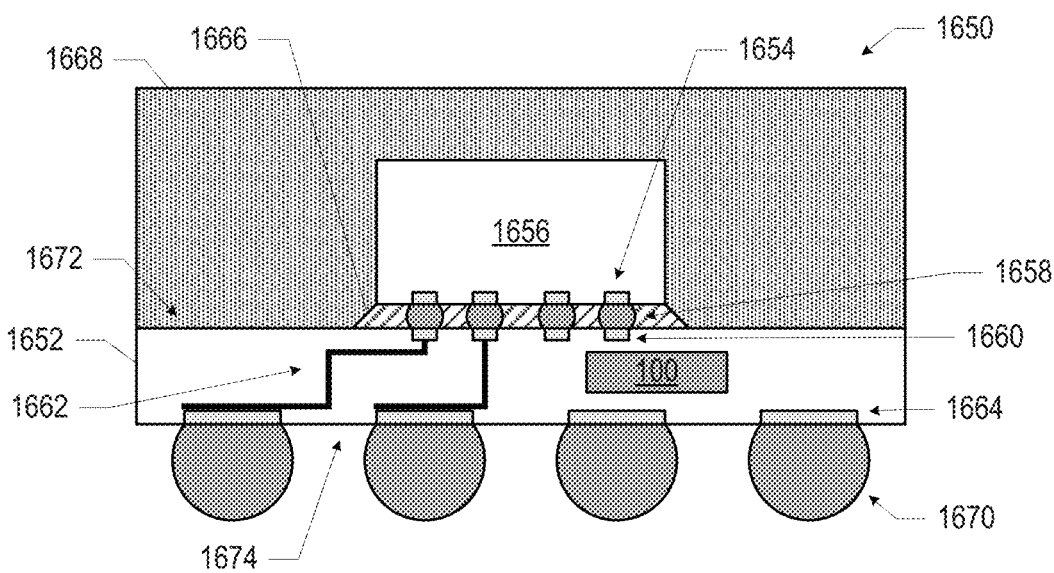
FIG. 30 is a cross-sectional side view of an IC package that may include an inductor/core assembly, in accordance with various embodiments.

FIG. 30 is a cross-sectional view of an example IC package 1650 that may include one or more inductor/core assemblies 100. The package substrate 1652 may be formed of a dielectric material and may have conductive pathways extending through the dielectric material between the face 1672 and the face 1674, between different locations on the face 1672, and/or between different locations on the face 1674. These conductive pathways may take the form of any of the interconnects 1628 discussed above with reference to FIG. 29. FIG. 30 illustrates a single inductor/core assembly 100 in the package substrate 1652, but this number and location of inductor/core assemblies 100 in the IC package 1650 is simply illustrative, and any number of inductor/core assemblies 100 (with any suitable structure) may be included in a package substrate 1652. In some embodiments, no inductor/core assemblies 100 may be included in the package substrate 1652.

The IC package 1650 may include a die 1656 coupled to the package substrate 1652 via conductive contacts 1654 of the die 1656, first-level interconnects 1658, and conductive contacts 1660 of the package substrate 1652. The conductive contacts 1660 may be coupled to conductive pathways 1662 through the package substrate 1652, allowing circuitry within the die 1656 to electrically couple to various ones of the conductive contacts 1664 or to the inductor/core assemblies 100 (or to other components included in the package substrate 1652, not shown). The first-level interconnects 1658 illustrated in FIG. 30 are solder bumps, but any suitable first-level interconnects 1658 may be used. As used herein, a "conductive contact" may refer to a portion of conductive material (e.g., metal) serving as an electrical interface between different components; conductive contacts may be recessed in, flush with, or extending away from a surface of a component and may take any suitable form (e.g., a conductive pad or socket).

In some embodiments, an underfill material 1666 may be disposed between the die 1656 and the package substrate 1652 around the first-level interconnects 1658, and a mold compound 1668 may be disposed around the die 1656 and in contact with the package substrate 1652. In some embodiments, the underfill material 1666 may be the same as the mold compound 1668. Example materials that may be used for the underfill material 1666 and the mold compound 1668 are epoxy mold materials, as suitable. Second-level interconnects 1670 may be coupled to the conductive contacts 1664. The second-level interconnects 1670 illustrated in FIG. 30 are solder balls (e.g., for a ball grid array arrangement), but any suitable second-level interconnects 16770 may be used (e.g., pins in a pin grid array arrangement or lands in a land grid array arrangement). The second-level interconnects 1670 may be used to couple the IC package 1650 to another component, such as a circuit board (e.g., a motherboard), an interposer, or another IC package, as known in the art and as discussed below with reference to FIG. 31.

In FIG. 30, the IC package 1650 is a flip chip package and includes an inductor/core assembly 100 in the package substrate 1652. The die 1656 may take the form of any of the embodiments of the die 1502 discussed herein (e.g., may include any of the embodiments of the IC device 1600). In some embodiments, the die 1656 may include one or more inductor/core assemblies 100 (e.g., as discussed above with reference to FIG. 28 and FIG. 29); in other embodiments, the die 1656 may not include any inductor/core assemblies 100.

Although the IC package 1650 illustrated in FIG. 30 is a flip chip package, other package architectures may be used. For example, the IC package 1650 may be a ball grid array (BGA) package, such as an embedded wafer-level ball grid array (eWLB) package. In another example, the IC package 1650 may be a wafer-level chip scale package (WLCSP) or a panel fanout (FO) package. Although a single die 1656 is illustrated in the IC package 1650 of FIG. 30, an IC package 1650 may include multiple dies 1656 (e.g., with one or more of the multiple dies 1656 coupled to inductor/core assemblies 100 included in the package substrate 1652). An IC package 1650 may include additional passive components, such as surface-mount resistors, capacitors, and inductors disposed on the first face 1672 or the second face 1674 of the package substrate 1652. More generally, an IC package 1650 may include any other active or passive components known in the art.

Figure 31:
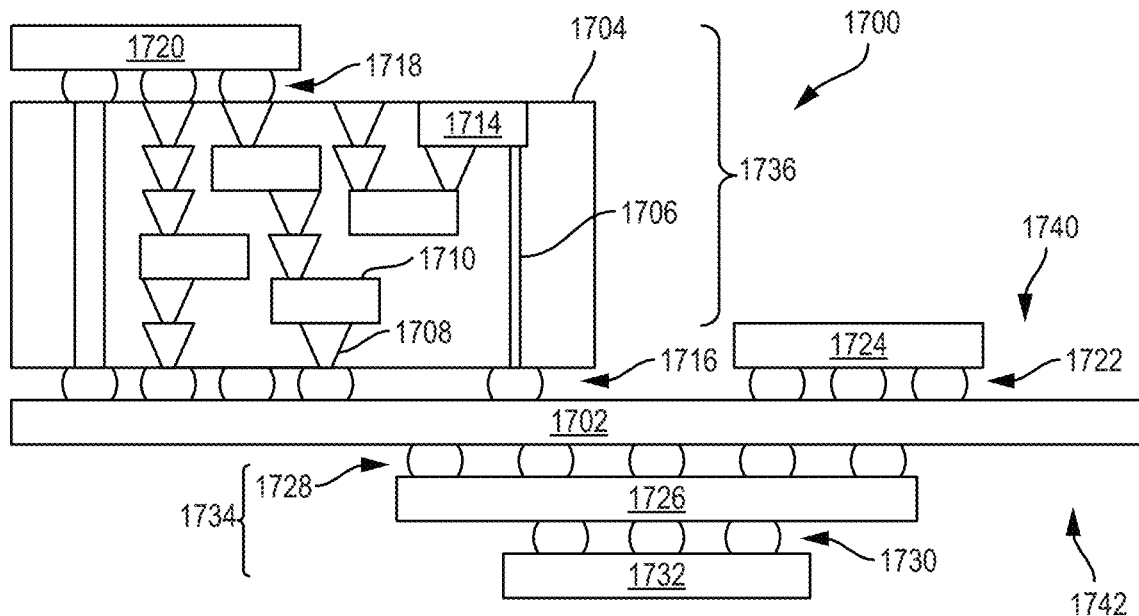
FIG. 31 is a cross-sectional side view of an IC device assembly that may include an inductor/core assembly, in accordance with any of the embodiments disclosed herein.

FIG. 31 is a cross-sectional side view of an IC device assembly 1700 that may include one or more IC packages or other electronic components (e.g., a die) including one or more inductor/core assemblies 100, in accordance with any of the embodiments disclosed herein. The IC device assembly 1700 includes a number of components disposed on a circuit board 1702 (which may be, e.g., a motherboard). The IC device assembly 1700 includes components disposed on a first face 1740 of the circuit board 1702 and an opposing second face 1742 of the circuit board 1702; generally, components may be disposed on one or both faces 1740 and 1742. Any of the IC packages discussed below with reference to the IC device assembly 1700 may take the form of any of the embodiments of the IC package 1650 discussed above with reference to FIG. 30 (e.g., may include one or more inductor/core assemblies 100 in a package substrate 1652 or in a die 1502).

In some embodiments, the circuit board 1702 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1702. In other embodiments, the circuit board 1702 may be a non-PCB substrate.

The IC device assembly 1700 illustrated in FIG. 31 includes a package-on-interposer structure 1736 coupled to the first face 1740 of the circuit board 1702 by coupling components 1716. The coupling components 1716 may electrically and mechanically couple the package-on-interposer structure 1736 to the circuit board 1702 and may include solder balls (as shown in FIG. 31), male and female portions of a socket, an adhesive, an underfill material, and/or any other suitable electrical and/or mechanical coupling structure.

The package-on-interposer structure 1736 may include an IC package 1720 coupled to an interposer 1704 by coupling components 1718. The coupling components 1718 may take any suitable form for the application, such as the forms discussed above with reference to the coupling components 1716. Although a single IC package 1720 is shown in FIG. 31, multiple IC packages may be coupled to the interposer 1704; indeed, additional interposers may be coupled to the interposer 1704. The interposer 1704 may provide an intervening substrate used to bridge the circuit board 1702 and the IC package 1720. The IC package 1720 may be or include, for example, a die (the die 1502 of FIG. 28), an IC device (e.g., the IC device 1600 of FIG. 29), or any other suitable component. Generally, the interposer 1704 may spread a connection to a wider pitch or reroute a connection to a different connection. For example, the interposer 1704 may couple the IC package 1720 (e.g., a die) to a set of BGA conductive contacts of the coupling components 1716 for coupling to the circuit board 1702. In the embodiment illustrated in FIG. 31, the IC package 1720 and the circuit board 1702 are attached to opposing sides of the interposer 1704; in other embodiments, the IC package 1720 and the circuit board 1702 may be attached to a same side of the interposer 1704. In some embodiments, three or more components may be interconnected by way of the interposer 1704.

The interposer 1704 may be formed of an epoxy resin, a fiberglass-reinforced epoxy resin, an epoxy resin with inorganic fillers, a ceramic material, or a polymer material such as polyimide. In some embodiments, the interposer 1704 may be formed of alternate rigid or flexible materials that may include the same materials described above for use in a semiconductor substrate, such as silicon, germanium, and other group III-V and group IV materials. The interposer 1704 may include metal interconnects 1708 and vias 1710, including, but not limited to, through-silicon vias (TSVs) 1706. The interposer 1704 may further include embedded devices 1714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 1704. The package-on-interposer structure 1736 may take the form of any of the package-on-interposer structures known in the art. In some embodiments, the interposer 1704 may include one or more inductor/core assemblies 100.

The IC device assembly 1700 may include an IC package 1724 coupled to the first face 1740 of the circuit board 1702 by coupling components 1722. The coupling components 1722 may take the form of any of the embodiments discussed above with reference to the coupling components 1716, and the IC package 1724 may take the form of any of the embodiments discussed above with reference to the IC package 1720.

The IC device assembly 1700 illustrated in FIG. 31 includes a package-on-package structure 1734 coupled to the second face 1742 of the circuit board 1702 by coupling components 1728. The package-on-package structure 1734 may include an IC package 1726 and an IC package 1732 coupled together by coupling components 1730 such that the IC package 1726 is disposed between the circuit board 1702 and the IC package 1732. The coupling components 1728 and 1730 may take the form of any of the embodiments of the coupling components 1716 discussed above, and the IC packages 1726 and 1732 may take the form of any of the embodiments of the IC package 1720 discussed above. The package-on-package structure 1734 may be configured in accordance with any of the package-on-package structures known in the art.

Figure 32:
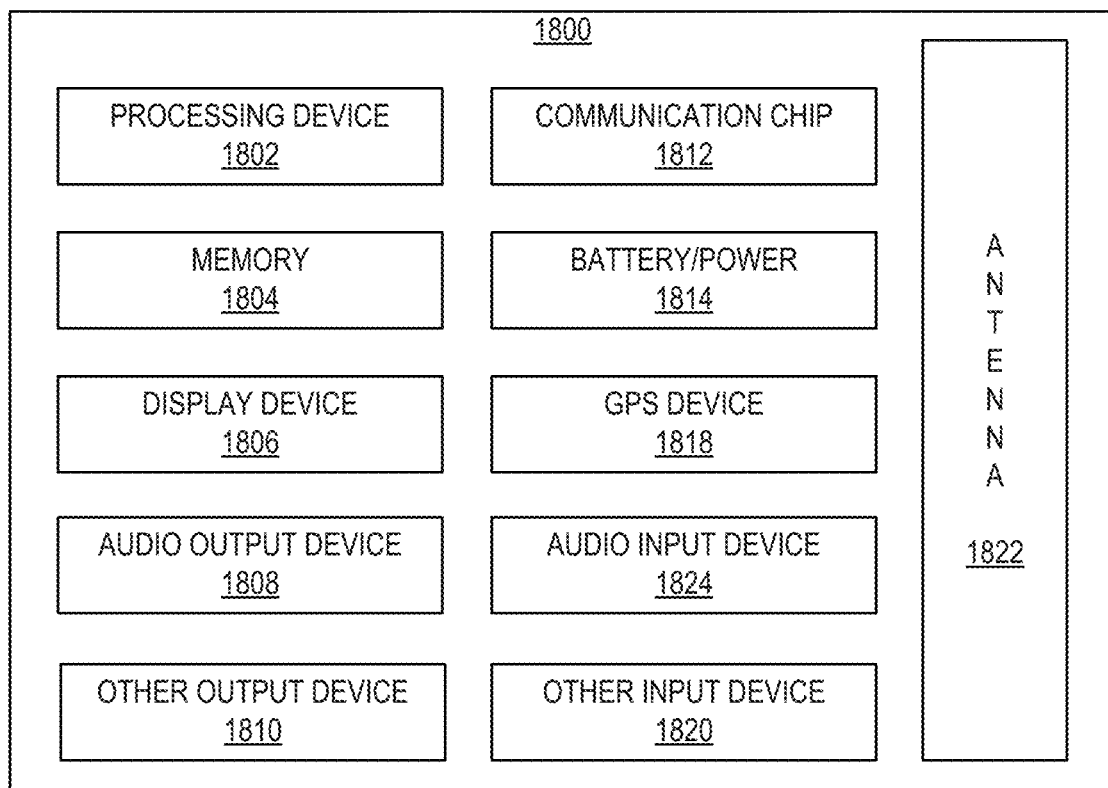
FIG. 32 is a block diagram of an example electrical device that may include an inductor/core assembly, in accordance with any of the embodiments disclosed herein.

FIG. 32 is a block diagram of an example electrical device 1800 that may include one or more inductor/core assemblies 100, in accordance with any of the embodiments disclosed herein. For example, any suitable ones of the components of the electrical device 1800 may include one or more of the IC packages 1650, IC devices 1600, or dies 1502 disclosed herein. A number of components are illustrated in FIG. 32 as included in the electrical device 1800, but any one or more of these components may be omitted or duplicated, as suitable for the application. In some embodiments, some or all of the components included in the electrical device 1800 may be attached to one or more motherboards. In some embodiments, some or all of these components are fabricated onto a single system-on-a-chip (SoC) die.

Additionally, in various embodiments, the electrical device 1800 may not include one or more of the components illustrated in FIG. 32, but the electrical device 1800 may include interface circuitry for coupling to the one or more components. For example, the electrical device 1800 may not include a display device 1806 but may include display device interface circuitry (e.g., a connector and driver circuitry) to which a display device 1806 may be coupled. In another set of examples, the electrical device 1800 may not include an audio input device 1824 or an audio output device 1808 but may include audio input or output device interface circuitry (e.g., connectors and supporting circuitry) to which an audio input device 1824 or audio output device 1808 may be coupled.

The electrical device 1800 may include a processing device 1802 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1802 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The electrical device 1800 may include a memory 1804, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 1804 may include memory that shares a die with the processing device 1802. This memory may be used as cache memory and may include embedded dynamic random access memory (eDRAM) or spin transfer torque magnetic random access memory (STT-M RAM).

In some embodiments, the electrical device 1800 may include a communication chip 1812 (e.g., one or more communication chips). For example, the communication chip 1812 may be configured for managing wireless communications for the transfer of data to and from the electrical device 1800. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1812 may operate in accordance with other wireless protocols in other embodiments. The electrical device 1800 may include an antenna 1822 to facilitate wireless communications and/or to receive other wireless communications (such as AM or FM radio transmissions).

In some embodiments, the communication chip 1812 may manage wired communications, such as electrical, optical, or any other suitable communication protocols (e.g., the Ethernet). As noted above, the communication chip 1812 may include multiple communication chips. For instance, a first communication chip 1812 may be dedicated to shorter-range wireless communications such as Wi-Fi or Bluetooth, and a second communication chip 1812 may be dedicated to longer-range wireless communications such as global positioning system (GPS), EDGE, GPRS, CDMA, WiMAX, LTE, EV-DO, or others. In some embodiments, a first communication chip 1812 may be dedicated to wireless communications, and a second communication chip 1812 may be dedicated to wired communications.

The electrical device 1800 may include battery/power circuitry 1814. The battery/power circuitry 1814 may include one or more energy storage devices (e.g., batteries or capacitors) and/or circuitry for coupling components of the electrical device 1800 to an energy source separate from the electrical device 1800 (e.g., AC line power).

The electrical device 1800 may include a display device 1806 (or corresponding interface circuitry, as discussed above). The display device 1806 may include any visual indicators, such as a heads-up display, a computer monitor, a projector, a touchscreen display, a liquid crystal display (LCD), a light-emitting diode display, or a flat panel display.

The electrical device 1800 may include an audio output device 1808 (or corresponding interface circuitry, as discussed above). The audio output device 1808 may include any device that generates an audible indicator, such as speakers, headsets, or earbuds.

The electrical device 1800 may include an audio input device 1824 (or corresponding interface circuitry, as discussed above). The audio input device 1824 may include any device that generates a signal representative of a sound, such as microphones, microphone arrays, or digital instruments (e.g., instruments having a musical instrument digital interface (MIDI) output).

The electrical device 1800 may include a GPS device 1818 (or corresponding interface circuitry, as discussed above). The GPS device 1818 may be in communication with a satellite-based system and may receive a location of the electrical device 1800, as known in the art.

The electrical device 1800 may include an other output device 1810 (or corresponding interface circuitry, as discussed above). Examples of the other output device 1810 may include an audio codec, a video codec, a printer, a wired or wireless transmitter for providing information to other devices, or an additional storage device.

The electrical device 1800 may include an other input device 1820 (or corresponding interface circuitry, as discussed above). Examples of the other input device 1820 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The electrical device 1800 may have any desired form factor, such as a hand-held or mobile electrical device (e.g., a cell phone, a smart phone, a mobile internet device, a music player, a tablet computer, a laptop computer, a netbook computer, an ultrabook computer, a personal digital assistant (PDA), an ultra mobile personal computer, etc.), a desktop electrical device, a server or other networked computing component, a printer, a scanner, a monitor, a set-top box, an entertainment control unit, a vehicle control unit, a digital camera, a digital video recorder, or a wearable electrical device. In some embodiments, the electrical device 1800 may be any other electronic device that processes data.

The following paragraphs provide various examples of the embodiments disclosed herein.

Example 1 is an integrated circuit (IC) structure, including: an air gap having a first wall and an opposite second wall; and a magnetic assembly in the air gap, wherein the magnetic assembly is in contact with a beam that extends at least between the first wall and the second wall.

Example 2 may include the subject matter of Example 1, and may further specify that the magnetic assembly is on a top surface of the beam.

Example 3 may include the subject matter of any of Examples 1-2, and may further specify that the magnetic assembly is in a same plane as the beam.

Example 4 may include the subject matter of any of Examples 1-3, and may further specify that the air gap extends around the beam.

Example 5 may include the subject matter of any of Examples 1-4, and may further specify that the beam includes an electrode.

Example 6 may include the subject matter of Example 5, and may further specify that the electrode is a first electrode, the air gap has a floor, and the IC structure further includes a second electrode proximate to the floor.

Example 7 may include the subject matter of any of Examples 5-6, and may further specify that the beam further includes a dielectric material.

Example 8 may include the subject matter of Example 7, and may further specify that the dielectric material is at least partially between the magnetic assembly and the electrode.

Example 9 may include the subject matter of any of Examples 1-8, and may further include: a first electrode proximate to the first wall and in electrical contact with the beam; and a second electrode proximate to the second wall and in electrical contact with the beam.

Example 10 may include the subject matter of Example 9, and may further specify that the beam includes a piezoelectric material.

Example 11 may include the subject matter of any of Examples 1-10, and may further include a dielectric material between the beam and a floor of the air gap.

Example 12 may include the subject matter of any of Examples 1-11, and may further include a dielectric material between the beam and a ceiling of the air gap.

Example 13 may include the subject matter of any of Examples 1-12, and may further include an inductor extending around the air gap.

Example 14 may include the subject matter of Example 13, and may further specify that the magnetic assembly is in a same plane as the inductor.

Example 15 may include the subject matter of any of Examples 13-14, and may further specify that the inductor includes copper.

Example 16 may include the subject matter of any of Examples 13-15, and may further specify that the inductor has a thickness between 2 microns and 5 microns.

Example 17 may include the subject matter of any of Examples 13-16, and may further specify that a segment of the inductor has a width between 0.5 microns and 3 microns.

Example 18 may include the subject matter of any of Examples 13-17, and may further specify that a distance between the magnetic assembly and the inductor is between 50 microns and 200 microns.

Example 19 may include the subject matter of any of Examples 1-18, and may further specify that the magnetic assembly includes a ferromagnetic material.

Example 20 may include the subject matter of any of Examples 1-19, and may further specify that the magnetic assembly includes alternating layers of magnetic material and layers of dielectric material.

Example 21 may include the subject matter of Example 20, and may further specify that an individual layer of magnetic material has a thickness between 100 nanometers and 400 nanometers.

Example 22 may include the subject matter of any of Examples 20-21, and may further specify that an individual layer of dielectric material has a thickness less than 100 nanometers.

Example 23 may include the subject matter of any of Examples 1-22, and may further specify that the first and second walls include a dielectric material.

Example 24 may include the subject matter of any of Examples 1-23, and may further specify that the beam includes an organic polymer, a silicone, polydimethylsiloxane, or silicon oxide.

Example 25 is an integrated circuit (IC) structure, including: an inductor; and a magnetic core in an interior of the inductor, wherein the magnetic core is movable perpendicular to a plane of the inductor.

Example 26 may include the subject matter of Example 25, and may further specify that the magnetic core is in an air gap.

Example 27 may include the subject matter of any of Examples 25-26, and may further specify that the magnetic core is mechanically coupled to a beam, and the IC structure includes at least two electrodes to control movement of the beam.

Example 28 may include the subject matter of any of Examples 25-27, and may further specify that the inductor includes one or more turns.

Example 29 may include the subject matter of any of Examples 25-28, and may further specify that the magnetic core includes alternating layers of magnetic material and layers of dielectric material.

Example 30 is an integrated circuit (IC) structure, including: an inductor; and a magnetic core in an interior of the inductor, wherein the magnetic core includes alternating layers of magnetic material and layers of dielectric material.

Example 31 may include the subject matter of Example 30, and may further specify that an individual layer of magnetic material has a thickness between 100 nanometers and 400 nanometers.

Example 32 may include the subject matter of any of Examples 30-31, and may further specify that an individual layer of dielectric material has a thickness less than 100 nanometers.

Example 33 may include the subject matter of any of Examples 30-32, and may further specify that the magnetic material includes cobalt iron.

Example 34 may include the subject matter of any of Examples 30-33, and may further specify that the dielectric material includes silicon.

Example 35 may include the subject matter of any of Examples 30-34, and may further specify that the dielectric material includes an oxide or a nitride.

Example 36 may include the subject matter of any of Examples 30-35, and may further specify that the magnetic core is in an air gap.

Example 37 may include the subject matter of Example 36, and may further specify that the magnetic core is supported in the air gap by a beam.

Example 38 is a method of operating an integrated circuit, including: causing a first set of electrical signals to be applied to a beam supporting a magnetic core in an interior of an inductor to move the magnetic core in a first direction; and causing a second set of electrical signals to be applied to the beam to cause the magnetic core to move in a second direction opposite to the first direction.

Example 39 may include the subject matter of Example 38, and may further specify that the first set of electrical signals are to cause at least a portion of the magnetic core to be non-coplanar with the inductor.

Example 40 may include the subject matter of any of Examples 38-39, and may further specify that the first direction is perpendicular to a plane of the inductor.

Example 41 may include the subject matter of any of Examples 38-40, and may further specify that the first set of electrical signals is to move the magnetic core a distance between 0.5 microns and 2 microns.

Example 42 may include the subject matter of any of Examples 38-41, and may further specify that the magnetic core is in an air gap.

Example 43 may include the subject matter of any of Examples 38-42, and may further specify that the magnetic core is in a metallization stack of a die.

Example 44 may include the subject matter of any of Examples 38-43, and may further specify that the beam includes a piezoelectric material.

Example 45 may include the subject matter of any of Examples 38-44, and may further specify that the beam includes a first electrode, and a second electrode is spaced apart from the beam.

Example 46 is a computing device, including: a die including an inductor and an air gap in an interior of the inductor, and may further specify that a magnetic core is in the air gap; and a circuit board, wherein the die is coupled to the circuit board.

Example 47 may include the subject matter of Example 46, and may further specify that the inductor is in a metallization stack of the die.

Example 48 may include the subject matter of any of Examples 46-47, and may further specify that the die is a radio frequency communication die.

Example 49 may include the subject matter of any of Examples 46-48, and may further include an antenna coupled to the circuit board.

Example 50 may include the subject matter of any of Examples 46-49, and may further specify that the die further includes an antenna.

Example 51 is a method of manufacturing any of the integrated circuit (IC) structures of any of Examples 1-37.

The invention claimed is:

1. An integrated circuit (IC) structure, comprising:
   a first wall;
   a second wall opposite the first wall, the first wall and the second wall separated by an air gap therebetween, the air gap spanning a distance between the first wall and the second wall;
   a beam that extends between the first wall and the second wall, the beam having a length equal to the distance between the first wall and the second wall, the beam in contact with the first wall and the second wall;
   a magnetic assembly in contact with the beam, wherein the air gap extends around the magnetic assembly and the beam; and
   an inductor around the air gap, wherein at least portion of the magnetic assembly is in an interior of the inductor.

2. The IC structure of claim 1, further comprising:
   a first electrode proximate to the first wall and in electrical contact with the beam; and
   a second electrode proximate to the second wall and in electrical contact with the beam.

3. The IC structure of claim 2, wherein the beam includes a piezoelectric material.

4. The IC structure of claim 1, wherein the magnetic assembly includes alternating layers of magnetic material and layers of dielectric material.

5. The IC structure of claim 4, wherein an individual layer of magnetic material has a thickness between 100 nanometers and 400 nanometers.

6. The IC structure of claim 1, wherein the magnetic assembly is on a top surface of the beam.

7. The IC structure of claim 1, wherein the magnetic assembly is in a same plane as the beam.

8. The IC structure of claim 1, wherein the beam includes an electrode.

9. The IC structure of claim 1, further comprising:
a dielectric material between the beam and a floor of the air gap.

10. The IC structure of claim 1, further comprising:
a dielectric material between the beam and a ceiling of the air gap.

11. The IC structure of claim 1, further comprising:
an inductor extending around the air gap.

12. The IC structure of claim 1, wherein the first and second walls include a dielectric material.

13. The IC structure of claim 1, wherein the beam includes an organic polymer, a silicone, polydimethylsiloxane, or silicon oxide.

14. An integrated circuit (IC) structure, comprising:
an inductor having a loop within a plane;
a magnetic core in an interior of the inductor, wherein the magnetic core is movable perpendicular to the plane of the inductor; and
a beam extending in the interior of the plane of the inductor, the beam extending between and in contact with a pair of walls, wherein an air gap is between the pair of walls, the air gap extends around the beam and the magnetic core, a distance between the pair of walls is equal to a length of the beam, and the inductor extends around the beam and around the air gap.

15. The IC structure of claim 14, wherein the magnetic core is in the air gap.

16. The IC structure of claim 14, wherein the magnetic core is mechanically coupled to the beam, and the IC structure includes at least two electrodes to control movement of the beam.

17. A computing device, comprising:
a die including an inductor and an air gap in an interior of a plane of the inductor, the inductor having a loop within the plane, wherein a magnetic core is in the air gap, the air gap having a pair of side walls, the air gap spanning a distance between the pair of side walls;
a beam that extends in the interior of the plane of the inductor between the pair of side walls, wherein the air gap extends around the beam and the magnetic core, and a length of the beam is equal to the distance between the pair of side walls; and
a circuit board, wherein the die is coupled to the circuit board.

18. The computing device of claim 17, wherein the inductor is in a metallization stack of the die.

19. The computing device of claim 17, wherein the die is a radio frequency communication die.

* * * * *